United States Patent
Ishii et al.

(10) Patent No.: US 8,432,190 B2
(45) Date of Patent: Apr. 30, 2013

(54) SEMICONDUCTOR DEVICE WITH REDUCED POWER CONSUMPTION

(75) Inventors: Toshinao Ishii, Tokyo (JP); Hisayuki Nagamine, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 13/084,926

(22) Filed: Apr. 12, 2011

(65) Prior Publication Data
US 2011/0254617 A1 Oct. 20, 2011

(30) Foreign Application Priority Data
Apr. 14, 2010 (JP) .................... 2010-093558

(51) Int. Cl.
*H01L 25/00* (2006.01)
(52) U.S. Cl.
USPC ............................................. 326/102
(58) Field of Classification Search ........ 326/37–47, 326/101, 102; 716/118, 119
See application file for complete search history.

(56) References Cited

U.S. PATENT DOCUMENTS

| | | | |
|---|---|---|---|
| 6,798,238 B2* | 9/2004 | Mushiga et al. | 326/37 |
| 7,755,396 B2* | 7/2010 | Shin et al. | 326/101 |
| 2004/0208046 A1* | 10/2004 | Yokozeki | 365/145 |
| 2007/0103195 A1* | 5/2007 | Duk-Sohn et al. | 326/41 |
| 2009/0027097 A1* | 1/2009 | Kanno et al. | 327/208 |
| 2010/0017775 A1* | 1/2010 | Kanno et al. | 716/16 |
| 2010/0171523 A1* | 7/2010 | Yamashita | 326/38 |
| 2011/0012180 A1* | 1/2011 | Matsuzaki et al. | 257/295 |
| 2011/0316620 A1* | 12/2011 | Kanno et al. | 327/543 |

FOREIGN PATENT DOCUMENTS

| | | |
|---|---|---|
| JP | 11-031385 | 2/1999 |
| JP | 2007-288004 | 11/2007 |
| JP | 2009-170650 | 7/2009 |

* cited by examiner

*Primary Examiner* — Thienvu Tran
(74) *Attorney, Agent, or Firm* — Young & Thompson

(57) ABSTRACT

A semiconductor device includes a reduced-power-consumption circuit block which includes first and second power lines, and a first circuit cell. The first circuit cell includes a first functional-element-free region. The first functional-element-free region includes a first driver circuit configured to connect and disconnect the first power line and the second power line.

20 Claims, 16 Drawing Sheets

VDD1: POWER SUPPLY POTENTIAL
VDD2: SECOND POWER SUPPLY POTENTIAL
VSS1: GROUND POTENTIAL
VSS2: SECOND GROUND POTENTIAL
CTRP: Pch DRIVER CONTROL SIGNAL
CTRN: Nch DRIVER CONTROL SIGNAL
IN: INPUT
OUT: OUTPUT

SEMICONDUCTOR DEVICE WITH REDUCED POWER CONSUMPTION

BACKGROUND OF THE INVENTION

1. Field of the Invention

The present invention generally relates to a semiconductor device.

Priority is claimed on Japanese Patent Application No. 2010-093558, filed Apr. 14, 2010, the content of which is incorporated herein by reference.

2. Description of the Related Art

To reduce power consumption of semiconductor devices, power saving has been performed by setting unused circuits to a standby state and making the sections to stop operation.

Since standby current flows through transistors even in this standby state, the current value of the standby current is substantial and not ignorable as semiconductor devices are large-scale.

Japanese Unexamined Patent Application Publication No. 11-31385 mentions that in order to reduce this standby current, there is used the following configuration. A sub-threshold current reduction circuit (SCRC) is provided with a plurality of switch circuits between a main power voltage supply line MVCY that transfers power voltage VCC and a sub-power voltage supply line SVCY that selectively transfers the power voltage VCC or a first voltage smaller by a predetermined value than the power voltage VCC.

The first voltage is selectively transferred by performing on/off control of the switch circuit in response to each of the states of the drive state and the standby state. Japanese Unexamined Patent Application Publication No. 11-31385 discloses a DRAM (Random Access Memory), in which this switch circuit is dispersed and arranged in the surface of the chip of the semiconductor device that halts the supply of the first voltage to a circuit set to the standby state.

Japanese Unexamined Patent Application Publication No. 2007-288004 discloses that in order to reduce the standby current, a driver circuit of a P-channel type MOS (Metal Oxide Semiconductor) transistor (hereinafter, referred to as the P-type transistor) is provided, as a switch. The P-channel type MOS transistor generates sub-power supply potential VCT on the basis of the power supply potential VCC. The P-channel type MOS transistor is disposed between an interconnection of the power supply potential VCC and the P-type transistor of an inverter I2.

A driver circuit of an N-channel type MOS transistor (hereinafter, referred to as the N-type transistor) is provided, as a switch. The N-channel type MOS transistor generates sub-ground potential VST on the basis of ground potential VSS. The N-channel type MOS transistor is disposed between an interconnection of the ground potential VSS and the N-type transistor of the inverter I2.

SUMMARY

In one embodiment, a semiconductor device may include, but is not limited to, first, second and third power lines, a first circuit block, and a plurality of third transistors. The first, second and third power lines extend in a first direction. The first, second and third power lines may be aligned in parallel in a second direction substantially perpendicular to the first direction. The first circuit block may be operable with a first voltage between the first and second power lines. The first circuit block may include, but is not limited to, a plurality of first transistors of a first conductivity type and a plurality of second transistors of a second conductivity type. At least one of the plurality of first transistors may be coupled to the third power line. The plurality of third transistors may be coupled between the first power line and the third power line. Each of the plurality of third transistors may be configured to connect the first power line and the third power line when the first circuit block is in an active state. Each of the plurality of third transistors may be configured to disconnect the first power line and the third power line when the first circuit block is in a stand-by state. One of the plurality of third transistors, one of the plurality of first transistors and one of the plurality of second transistors in a first region between the first and second power lines may be aligned in the second direction.

In another embodiment, a semiconductor device may include, but is not limited to, first and second power lines, a plurality of circuit cells, a plurality of first transistors, a plurality of second transistors, a third transistor, a plurality of first interconnection layers, a plurality of second interconnection layers, a plurality of third interconnection layers, and a plurality of fourth interconnection layers. The first and second power lines extend in a first direction. The plurality of circuit cells may be aligned in the first direction. Each of the plurality of circuit cells may include, but is not limited to, a first region of a first conductivity type. The plurality of first transistors may be disposed in the first regions of parts of the plurality of circuit cells. Each of the plurality of first transistors may include, but is not limited to, first and second diffusion layers and a first gate electrode. The plurality of second transistors may be disposed in the first regions of the remaining parts of the plurality of circuit cells. Each of the plurality of second transistors may include, but is not limited to, third and fourth diffusion layers and a second gate electrode. The third transistor may be disposed in the first region of at least one of the plurality of circuit cells. The third transistor may include, but is not limited to, fifth and sixth diffusion layers and a third gate electrode. The plurality of first interconnection layers may be configured to connect the first power line to the first diffusion layers of the plurality of first transistors. The plurality of second interconnection layers may be configured to connect the second power line to the third diffusion layers of the plurality of second transistors. The plurality of third interconnection layers may be configured to connect the first power line to the fifth diffusion layers of the plurality of third transistors. The plurality of fourth interconnection layers may be configured to connect the second power line to the sixth diffusion layers of the plurality of third transistors.

In still another embodiment, a semiconductor device may include, but is not limited to, a reduced-power-consumption circuit block. The reduced-power consumption circuit block may include, but is not limited to, first and second power lines, a first circuit cell, and a first functional-element region. The first circuit cell may include, but is not limited to, a first functional-element-free region. The first functional-element-free region may include, but is not limited to, a first driver circuit configured to connect and disconnect the first power line and the second power line. The first functional-element region may include, but is not limited to, a first functional semiconductor device. The first functional semiconductor device may include, but is not limited to, a first transistor of a first conductivity type and a second transistor of a second conductivity type. The first functional semiconductor device operates when the current reduction circuit is in an active state.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
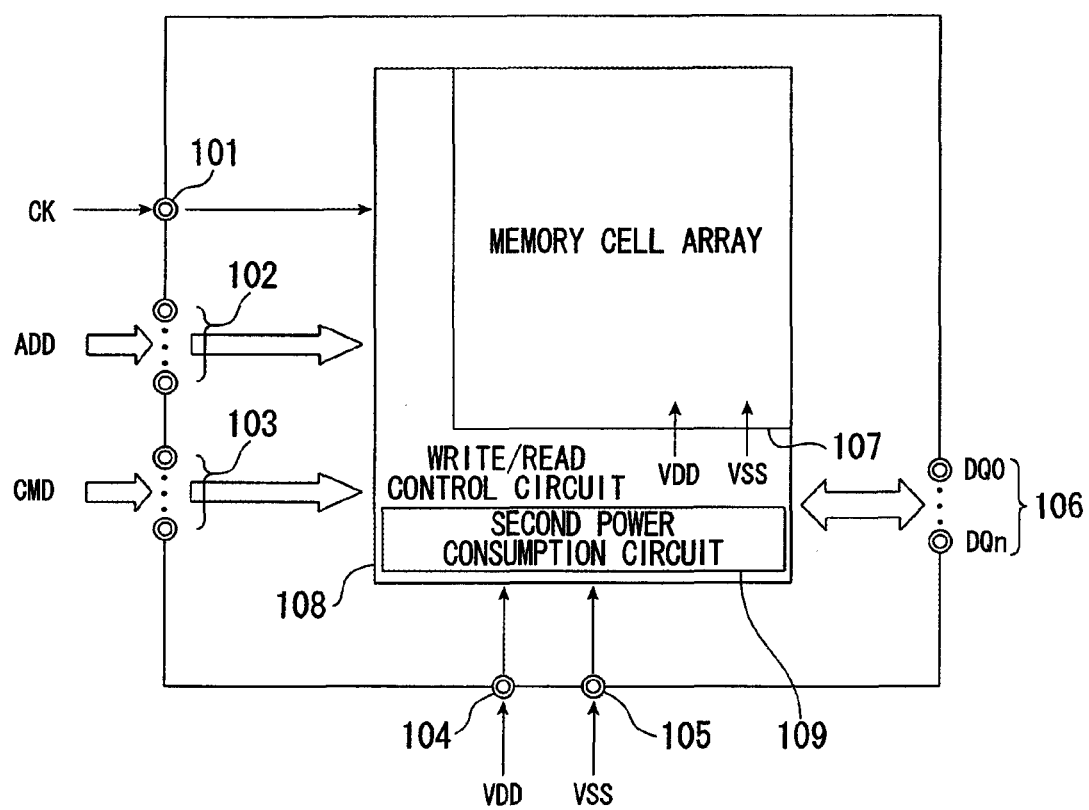
FIG. 1 is a schematic block diagram illustrating the configuration of a semiconductor device according to an embodiment of the invention.

Before describing the present invention, the related art will be explained in detail with reference to the publications, in order to facilitate the understanding of the present invention.

Japanese Unexamined Patent Application Publications Nos. 11-31385 and No. 2007-288004 mention the case of the standby state. By setting the switch circuit or the switch to an off-state, no standby current flows between the power supply potential and the ground potential, whereby it is possible to reduce the standby current in the standby state.

Japanese Unexamined Patent Application Publication No. 11-31385 mentions that when a MOS transistor (hereinafter, referred to as the transistor) serving as a switch circuit is dispersed and arranged in the surface of the chip. Each of the switch circuits is formed as an independent circuit block (circuit cell).

Each of the switch circuits is provided to a different circuit block formed in a region different from a circuit block which operates by receiving the supply of a voltage from the main power voltage supply line MVCY and the like or the sub power voltage supply line SVCY.

When a standby-current-reduction circuit block is provided, the layout area increases by the circuit block of the switch circuit, and thus the chip area of the whole DRAM increases.

Japanese Unexamined Patent Application Publication No. 2007-288004 mentions that each of the driver circuit of the power voltage VCC side and the driver circuit of the ground potential VSS side is required to share the transistor in which inverters are formed adjacent to each other and a diffusion layer of the source side, in order to reduce the layout area of the transistor.

For this reason, the driver has to be arranged only in the portion to which the diffusion layer of the source side is adjacent, and thus the degree of freedom at the time of designing the standby-current-reduction circuit block is limited.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, first, second and third power lines, a first circuit block, and a plurality of third transistors. The first, second and third power lines extend in a first direction. The first, second and third power lines may be aligned in parallel in a second direction substantially perpendicular to the first direction. The first circuit block may be operable with a first voltage between the first and second power lines. The first circuit block may include, but is not limited to, a plurality of first transistors of a first conductivity type and a plurality of second transistors of a second conductivity type. At least one of the plurality of first transistors may be coupled to the third power line. The plurality of third transistors may be coupled between the first power line and the third power line. Each of the plurality of third transistors may be configured to connect the first power line and the third power line when the first circuit block is in an active state. Each of the plurality of third transistors may be configured to disconnect the first power line and the third power line when the first circuit block is in a stand-by state. One of the plurality of third transistors, one of the plurality of first transistors and one of the plurality of second transistors in a first region between the first and second power lines may be aligned in the second direction.

In some cases, the first circuit block in the first region may include, but is not limited to, a plurality of circuit cells, each circuit cell comprises at least one of the plurality of first transistors and at least one of the plurality of second transistors.

In some cases, at least one circuit cell of the plurality of circuit cells may include, but is not limited to, first and second diffusion regions of at least one of the plurality of first transistors, third and fourth diffusion regions of at least one of the plurality of second transistors, and fifth and sixth diffusion regions as source and drain regions of the plurality of third transistors. The fifth and sixth diffusion regions may be disposed in different regions from the first, second, third and fourth diffusion regions.

In some cases, the semiconductor device may further include, but is not limited to, a plurality of fourth transistors which are disposed between the first and third power lines. Each of the plurality of fourth transistors may be configured to connect the first and third power lines when the first circuit block is in the active state. Each of the plurality of fourth transistors may be configured to disconnect the first and third power lines when the first circuit block is in the stand-by state. Each of the plurality of fourth transistors and at least a correspondent transistor of the plurality of first transistors and the plurality of second transistors in the first region may be aligned in the second direction.

In another embodiment, a semiconductor device may include, but is not limited to, first and second power lines, a plurality of circuit cells, a plurality of first transistors, a plurality of second transistors, a third transistor, a plurality of first interconnection layers, a plurality of second interconnection layers, a plurality of third interconnection layers, and a plurality of fourth interconnection layers. The first and second power lines extend in a first direction. The plurality of circuit cells may be aligned in the first direction. Each of the plurality of circuit cells may include, but is not limited to, a first region of a first conductivity type. The plurality of first transistors may be disposed in the first regions of parts of the plurality of circuit cells. Each of the plurality of first transistors may include, but is not limited to, first and second diffusion layers and a first gate electrode. The plurality of second transistors may be disposed in the first regions of the remaining parts of the plurality of circuit cells. Each of the plurality of second transistors may include, but is not limited to, third and fourth diffusion layers and a second gate electrode. The third transistor may be disposed in the first region of one of the plurality of circuit cells. The third transistor may include, but is not limited to, fifth and sixth diffusion layers and a third gate electrode. The plurality of first interconnection layers may be configured to connect the first power line to the first diffusion layers of the plurality of first transistors. The plurality of second interconnection layers may be configured to connect the second power line to the third diffusion layers of the plurality of second transistors. The third interconnection layer may be configured to connect the first power line to the fifth diffusion layers of the third transistor. The fourth interconnection layer may be configured to connect the second power line to the sixth diffusion layers of the third transistor.

In some cases, each of the plurality of circuit cells may include, but is not limited to, a second region of a second conductivity type different from the first conductivity type. First and second regions of each of the plurality of circuit cells are aligned in line in the second direction substantially parallel to the first direction. The semiconductor device may further include, but is not limited to, third and fourth power lines, a plurality of fourth transistors, a plurality of fifth transistors, a sixth transistor, a fifth interconnection layer, a sixth interconnection layer, a seventh interconnection layer, and an eighth interconnection layer. The third and fourth power lines extend in the first direction. The plurality of fourth transistors may be disposed in the second regions of parts of the plurality of circuit cells. Each of the plurality of fourth transistors may include, but is not limited to, seventh and eighth diffusion layers and a fourth gate electrode. The plurality of fifth transistors may be disposed in the second regions of the remaining parts of the plurality of circuit cells. Each of the plurality of fifth transistors may include, but is not limited to, ninth and tenth diffusion layers and a fifth gate electrode. The sixth transistor may be disposed in the second region of at least one of the plurality of circuit cells. The sixth transistor may include, but is not limited to, eleventh and twelfth diffusion layers and a sixth gate electrode. The fifth interconnection layer may be configured to connect the third power line to the seventh diffusion layers of the plurality of fourth transistors. The sixth interconnection layer may be configured to connect the fourth power line to the ninth diffusion layers of the plurality of fifth transistors. The seventh interconnection layer may be configured to connect the third power line to the eleventh diffusion layer of the sixth transistor. The eighth interconnection layer may be configured to connect the fourth power line to the twelfth diffusion layer of the sixth transistor.

In some cases, the third gate electrode of each of the plurality of third transistors may be configured to receive a first control signal. The first control signal takes a first logic level and each of the plurality of third transistors is placed in a conductive state when the plurality of circuit cells are in an active state. The first control signal takes a second logic level and each of the plurality of third transistors is placed in a non-conductive state when the plurality of circuit cells are in a stand-by state.

In some cases, the plurality of circuit cells may include, but is not limited to, a plurality of first circuit cells, and a plurality of second circuit cells. Each of the plurality of first circuit cells may include, but is not limited to, a corresponding one of the plurality of first transistors and a corresponding one of the plurality of fourth transistors. Each of the plurality of second circuit cells may include, but is not limited to, a corresponding one of the plurality of second transistors and a corresponding one of the plurality of fifth transistors. The plurality of first circuit cells and the plurality of second circuit cells may be alternately arranged.

In some cases, one of the plurality of third transistors may be placed to extend over two adjacent circuit cells of the plurality of circuit cells.

In some cases, the third gate electrode and the fifth and sixth diffusion layers of the third transistor placed over the two adjacent circuit cells may extend in the first direction.

In some cases, the first power line may have a first power potential. When the plurality of circuit cells are in a stand-by state, the third power line has a second power potential lower than the first power potential and the third transistor disconnects the first power line and the second power line.

In still another embodiment, a semiconductor device may include, but is not limited to, a reduced-power-consumption circuit block. The reduced-power consumption circuit block may include, but is not limited to, first and second power lines, a first circuit cell, and a first functional-element region. The first circuit cell may include, but is not limited to, a first functional-element-free region. The first functional-element-free region may include, but is not limited to, a first driver circuit configured to connect and disconnect the first power line and the second power line. The first functional-element region may include, but is not limited to, a first functional semiconductor device. The first functional semiconductor device may include, but is not limited to, a first transistor of a first conductivity type and a second transistor of a second conductivity type. The first functional semiconductor device operates when the current reduction circuit is in an active state.

In some cases, the first functional-element-free region may be free of any functional-element which operates when the current reduction circuit is in an active state.

In some cases, the first functional-element region may be adjacent to the first functional-element-free region.

In some cases, the first circuit cell comprises a first power shutdown configuration, configured to reduce a sub-threshold leakage current of the first functional semiconductor device.

In some cases, the reduced-power-consumption circuit block may further include, but is not limited to, an input node and an output node. The input node may be configured to be fixed at an input voltage level when the semiconductor device is in a stand-by state. The output node may be configured to be fixed at an output voltage level when the semiconductor device is in the stand-by state.

In some cases, the first circuit cell may include, but is not limited to, a first power shutdown configuration. The first power shutdown configuration may include, but is not limited to, a first sub-power line, a second sub-power line, a first local line coupled to the first power line, a first sub-local line coupled to the first sub-power line, a second local line coupled to the second sub-power line, and a second sub-local line coupled to the second sub-power line. The first driver circuit may be configured to connect and disconnect the first local line and the first sub-local line. The first driver circuit may be configured to connect and disconnect the second local line and the second sub-local line.

In some cases, the reduced-power-consumption circuit block may further include, but is not limited to, a second circuit cell. The second circuit cell may include, but is not limited to, a second functional-element-free region. The second functional-element-free region may include, but is not limited to, a second driver circuit controlling transmission of the voltage of the first power line to the second power line. The first and second circuit cells maybe adjacent to each other and aligned in a direction in which the first power line and the second power line extend.

In some cases, the semiconductor device may further include, but is not limited to, a first memory cell array, and a read/write control circuit that includes the reduced-power-consumption circuit block.

In some cases, the semiconductor device may further include, but is not limited to, first and second memory cell arrays; and a separation region which separates the first memory cell array from the second memory cell array. The reduced-power consumption circuit block may be disposed in the separation region.

First Embodiment

Hereinafter, embodiments of the invention will be described with reference to the drawings. FIG. 1 is a schematic block diagram illustrating the configuration of a semiconductor device according to an embodiment of the invention. FIG. 1 shows the configuration of a DRAM as an example of the semiconductor device.

In FIG. 1, the semiconductor device according to the embodiment may include, but is not limited to, a clock terminal 101, an address terminal 102, a command (CMD) terminal 103, a power supply (VDD) terminal 104, a ground (VSS) terminal 105, a data input/output terminal 106, a memory cell array 107, a write/read control circuit 108 and a second power consumption circuit 109.

The write/read control circuit 108 is configured such that a drive voltage is supplied from the power supply terminal 104 and the ground terminal 105.

The write/read control circuit 108 operates in response to a clock signal supplied from the clock terminal 101. The write/read control circuit 108 performs operations of writing data, supplied from the data input/output terminal 106, to a memory element included in the memory cell array 107. The write/read control circuit 108 performs operations of output- ting data, read out from the memory element, from the data input/output terminal, by an address signal and a command signal supplied from the address terminal 102 and the command terminal 103.

The second power consumption circuit 109 is included in the write/read control circuit 108. When the semiconductor device is in a standby state, the second power consumption circuit is configured to fix an input level and an output level. The input level is a voltage level of an input signal in an input node of this circuit. The output level is a voltage level of an output signal in an output node of this circuit.

A part or the entirety of the second power consumption circuit 109 uses a power shutdown configuration configured to reduce a sub-threshold leakage current of a functional element included in this circuit such as a transistor.

Figure 2:
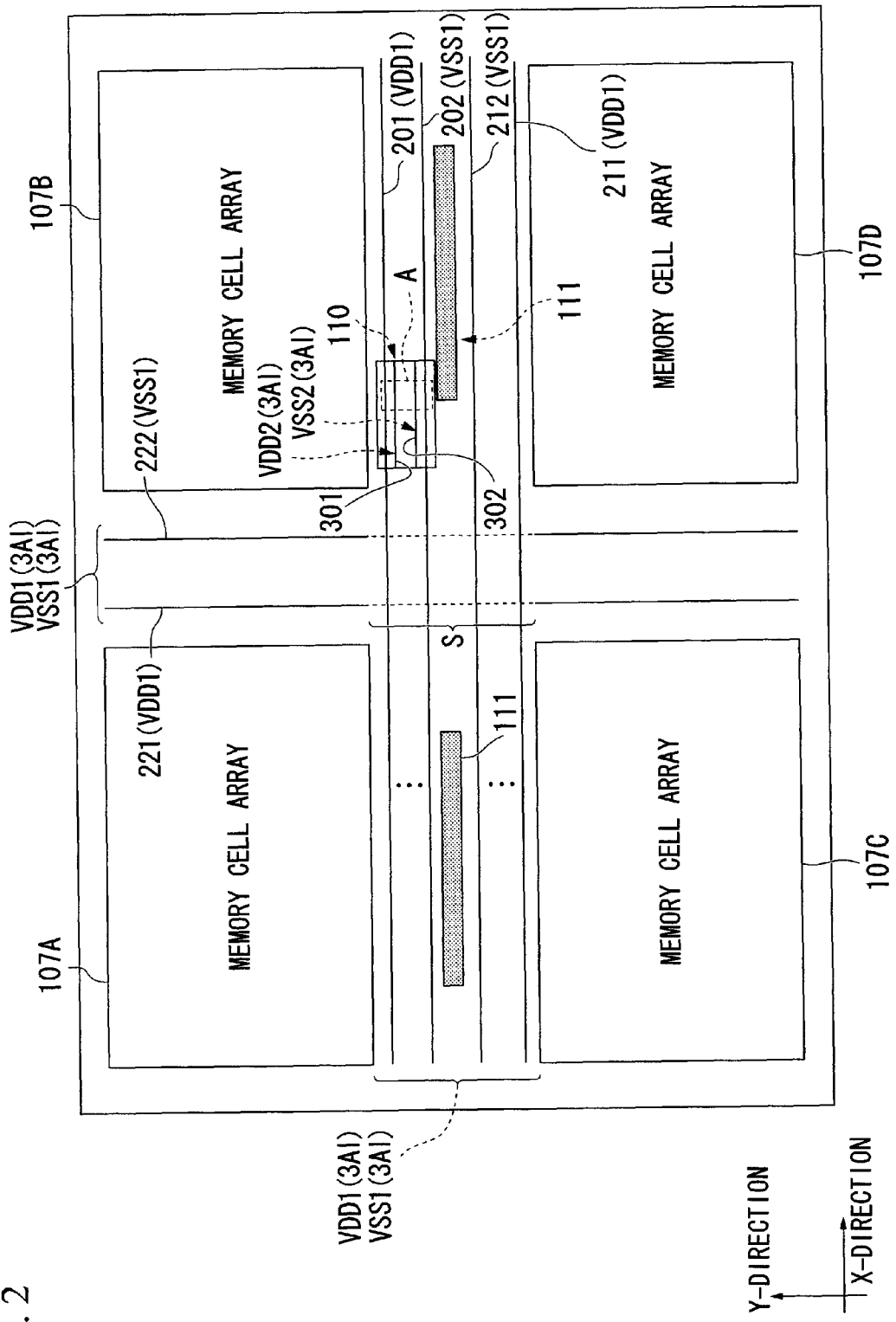
FIG. 2 is a diagram illustrating an example of the configuration of an arrangement of memory cells and power supply lines in the semiconductor device on a chip shown in FIG. 1.

FIG. 2 is a diagram illustrating an example of the configuration of the arrangement of memory cells and power supply lines in the semiconductor device on a chip. In the chip of the semiconductor device, a memory cell array 107 in FIG. 1 is divided and arranged with, for example, memory cell arrays 107A, 107B, 107C, and 107D. The memory cell array 107 is configured such that main power supply interconnections 201, 211 and 221 of a power supply potential VDD1 and main ground interconnections 202, 212 and 222 of a ground potential VSS1 are arranged as power supply lines in separation regions which separate the memory cell arrays from each other.

The main power supply interconnections 201 and 211 and the main ground interconnections 202 and 212 are arranged extending in the X-direction, and the main power supply interconnection 221 and the main ground interconnection 222 are arranged extending in the Y-direction which is a vertical direction to the X-direction. The X-direction and the Y-direction show directions on the two-dimensional plane in the drawing.

The regions separating the memory cell arrays from each other are further provided with the write/read control circuit 108 (not shown) including a pad region 111 in which pads of each of the terminals are arranged and the second power consumption circuit 109.

In the embodiment of FIG. 2, the main power supply interconnections 201 and 211 and the main ground interconnections 202 and 212, and the main power supply interconnection 221 and the main ground interconnection 222 intersect each other at the central region S of the chip. For this reason, the main power supply interconnection 221 and the main ground interconnection 222 which are equivalent to the portion of the central region S of the chip are formed, using the lower-layer interconnections, with respect to the main power supply interconnections 201 and 211, the main ground interconnections 202 and 212, and the main power supply interconnection 221 and the main ground interconnection 222 other than the portion of the central region S of the chip. The main power supply interconnections 201 and 211, the main ground interconnections 202 and 212, and the main power supply interconnection 221 and the main ground interconnection 222 other than the central region S of the chip are formed by the same interconnection layer. An insulating layer is formed between the interconnection layers.

In a second power consumption circuit region 110, since the power shutdown configuration is used, a sub-power supply line 301 of a second power supply potential VDD2 and a sub-ground line 302 of a second ground potential VSS2 are provided extending in the X-direction. The sub-power supply line 301 and the sub-ground line 302 are formed by the same interconnection layer with respect to the main power supply interconnections 201 and 211, the main ground interconnections 202 and 212, and the main power supply interconnection 221 and the main ground interconnection 222 other than the portion of the central region S of the chip.

The second power supply using region 110 may be configured to be independently set for each circuit unit that uses a power shutdown configuration, to be provided with the sub-power supply line 301 and the sub-ground line 302 which are independent of each other, and to perform the control of power supply shutdown for each circuit unit.

Figure 3:
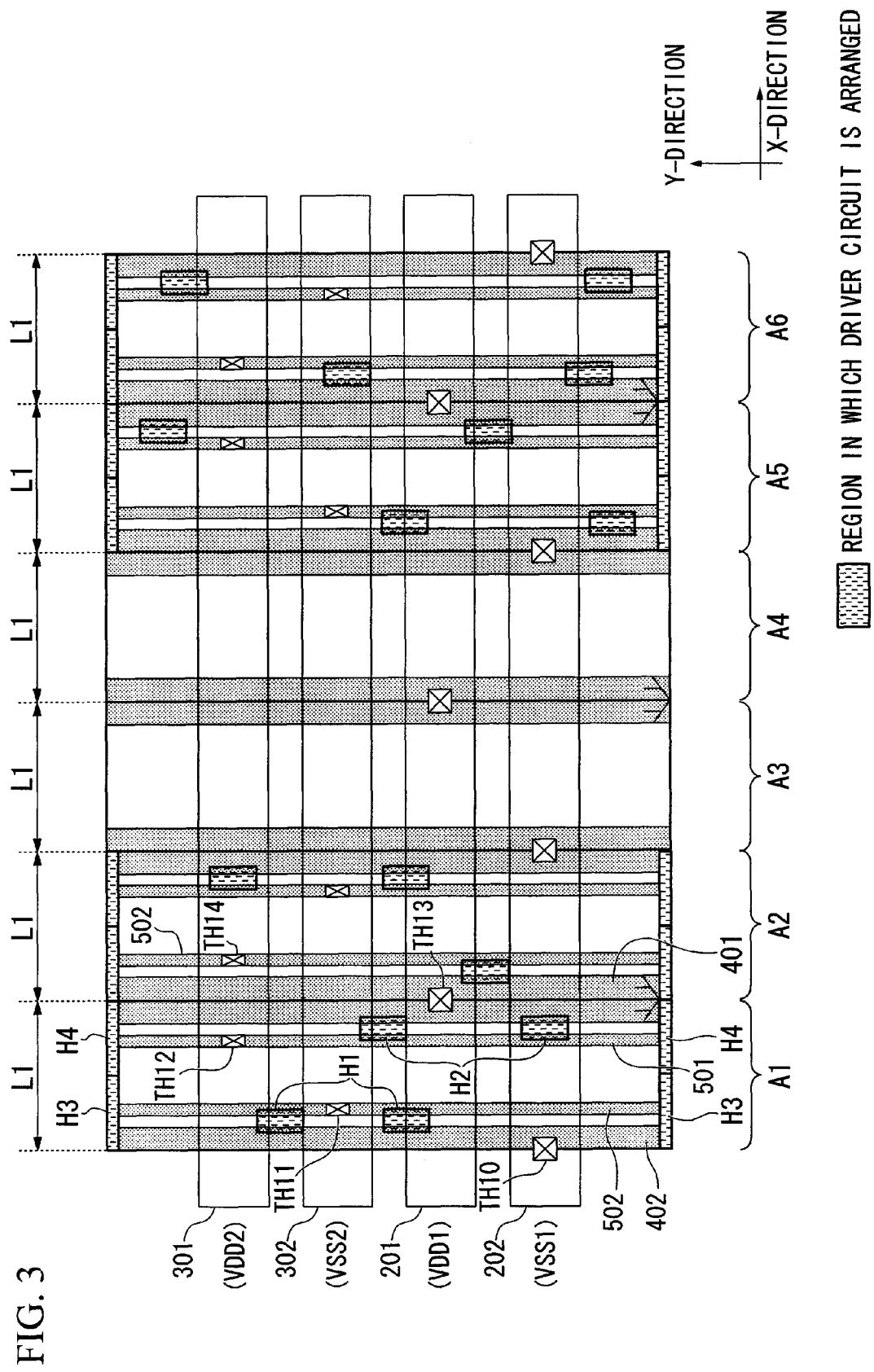
FIG. 3 is a fragmentary enlarged view of a region A in a layout of a second power supply region shown in FIG. 2.

FIG. 3 is a fragmentary enlarged view of a region A in the layout of the second power supply region 110 shown in FIG. 2.

As shown in FIG. 3, the second power supply region 110 according to the embodiment includes cell areas A1, A2, A5, and A6 which are regions in which circuits that use the power shutdown configuration are arranged. The cell area indicates a region in which a plurality of circuit cells having the same dimension (length of L1 in the X-direction, in the drawing) is arranged in a row in the width direction thereof (Y-direction in the drawing). As shown in FIG. 3, the circuits (cell areas A3 and A4) that do not use the power shutdown configuration may be included in this region. The circuit that does not use the power shutdown configuration is not directly related to the embodiment, and thus hereinafter, the region in which the circuit that uses the power shutdown configuration is arranged will be described taking the cell area A1 as an example. The cell areas A2, A5, and A6 also have the same configuration as that of the cell area A1.

A main power supply local line 401, a main ground local line 402, a sub-power supply local line 501, a sub-ground local line 502, and through-holes TH10 to TH13 are arranged in the cell area A1 in addition to a plurality of circuit cells included in the cell area A1.

The main power supply local line 401, the main ground local line 402, the sub-power supply local line 501, and the sub-ground local line 502 are formed in the lower-layer interconnection layer of the main power supply interconnection 201, the main ground interconnection 202, the sub-power supply line 301 and the sub-ground line 302, and are provided extending in the Y-direction.

The main power supply local line 401, the main ground local line 402, the sub-power supply local line 501, and the sub-ground local line 502 are formed in the same interconnection layer in a line in the X-direction.

The main power supply local line 401 is connected to the main power supply interconnection 201 through the through-hole TH13 formed in the insulating layer, and the power supply potential VDD1 is transferred thereto from the main power supply interconnection 201.

The main ground local line 402 is connected to the main ground interconnection 202 through the through-hole TH10 formed in the insulating layer, and the ground potential VSS1 is transferred thereto from the main ground interconnection 202.

The sub-power supply local line 501 is connected to the sub-power supply line 301 through the through-hole TH12 formed in the insulating layer. The sub-ground local line 502 is connected to the sub-ground line 302 through the through-hole TH11 formed in the insulating layer.

A plurality of circuit cells included in the cell area A1 includes a plurality of circuit cells in which functional transistors which are functional elements (hereinafter, also simply referred to as the functional transistors) is formed, respectively. The circuit cell in which driver circuits H1 and H2 are formed is included in at least one of a plurality of circuit cells, in which these functional cells are formed, together with the functional transistors. Although not specifically limited, the cell area A1 does not further include the functional transistors, and may include the circuit cell in which only the driver circuits H3 and H4 are formed. The circuit cell in which these functional transistors are included therein and only the driver circuits H3 and H4 are formed is preferably arranged at the end of the cell area A1 in the Y-direction.

The driver circuits H1 to H4 are circuits including switch circuits driven by the transistor (hereinafter, also simply referred to as the driver transistors). When these driver transistors are in an on-state, each of the corresponding main power supply local line or main ground local line, and sub-power supply local line or sub-ground local line are electrically connected to each other, and when these driver transistors are in an off-state, each of the corresponding main power supply local line or main ground local line, and sub-power supply local line or sub-ground local line are electrically separated from each other.

As an example, the driver circuit H1 is configured as follows. When the driver transistor included in the driver circuit H1 is in an on-state, the main ground local line 402 and the sub-ground local line 502 are electrically connected to each other. The ground potential VSS1 of the main ground local line 402 is transferred to the sub-ground local line 502. When the driver transistor included in the driver circuit H1 is in an off-state, the main ground local line 402 and the sub-ground local line 502 are electrically separated from each other. The ground potential VSS1 of the main ground local line 402 is transferred to the sub-ground local line 502. In this case, the sub-ground local line 502 becomes a floating state.

Similarly to other driver circuits H2 to H4, when the driver transistor included in each of the driver circuits is in an on-state, the potential VDD1 of the main power supply local line corresponding to each of these driver circuits H2 to H4 is transferred to the corresponding sub-power supply local line, or the potential VSS1 of the main ground local line is transferred to the corresponding sub-ground local line. When the driver transistor included in each of the driver circuits is in an off-state, the sub-power supply local line or the sub-ground local line corresponding to each of these driver circuits H2 to H4 becomes a floating state.

When the driver transistor is in an on-state, the potential difference due to on-resistance of the switch circuit occurs between the potentials of the potential of the main power supply local line or the potential of the main ground local line and the potential of the sub-power supply local line or the potential of the sub-ground local line which are connected corresponding to each of them. In the embodiment, the on-resistance of the driver transistor is set to a sufficiently low value, and the substantial potential difference does not occur, in the on-state of the driver transistor, between the potential of the main power supply local line or the potential of the main ground local line and the sub-power supply local line or the sub-ground local line which are connected corresponding to each of them. For this reason, the ground potentials VSS1 and VSS2 are substantially the same potential, and similarly, the power supply potentials VDD1 and VDD2 are substantially the same potential.

The sub-power supply line 301 is configured as follows. The power supply potential VDD1 of the main power supply interconnection 201 is transferred thereto from the main power supply local line 401 through the sub-power supply local line 501 by the on-state of the driver transistor included in the driver circuits H2 and H4. The sub-power supply line becomes a floating state by the off-state of the driver transistor included in the driver circuits H2 and H4.

The sub-ground line 302 is configured as follows. The ground potential VSS1 of the main ground interconnection 202 is transferred thereto from the main ground local line 412 through the sub-ground local line 502 by the on-state of the driver transistor included in the driver circuits H1 and H3. The sub-ground line becomes a floating state by the off-state of the driver transistor included in the driver circuits H1 and H3.

Figure 4:
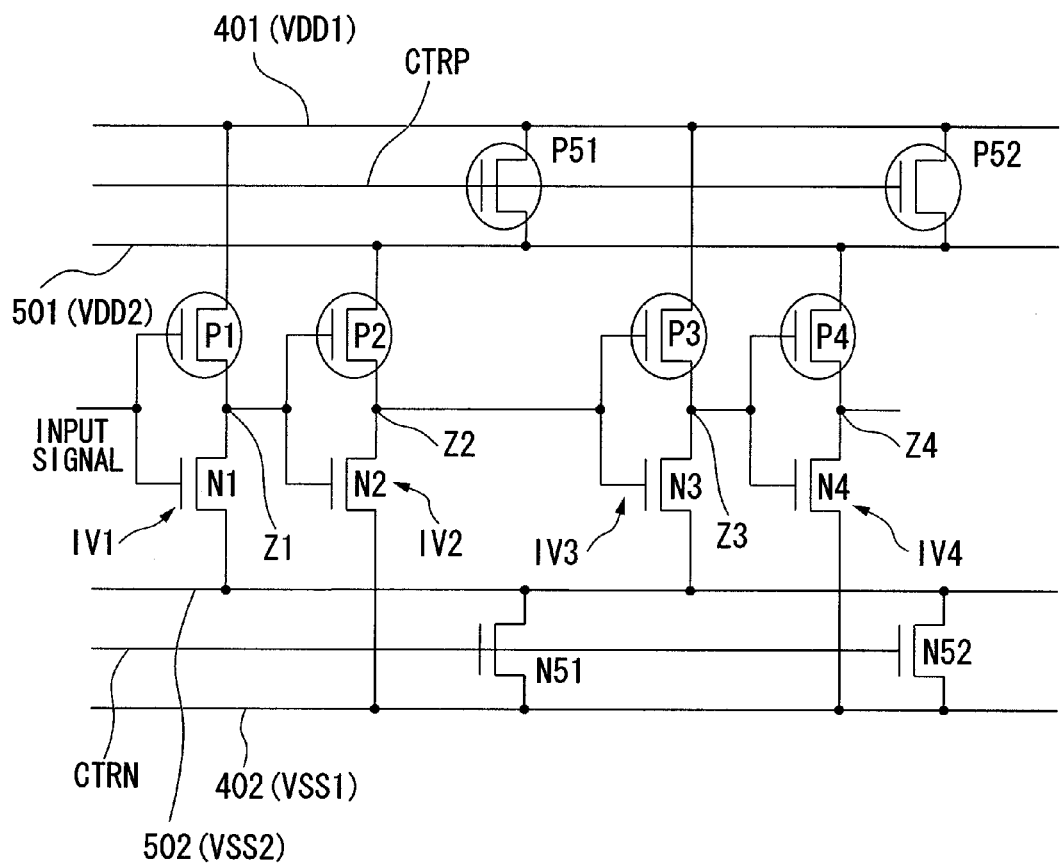
FIG. 4 is a circuit diagram illustrating a series circuit of inverters as an example of the second power consumption circuit formed in cell areas A1, A2, A5, and A6 shown in FIG. 3.
Figure 5:
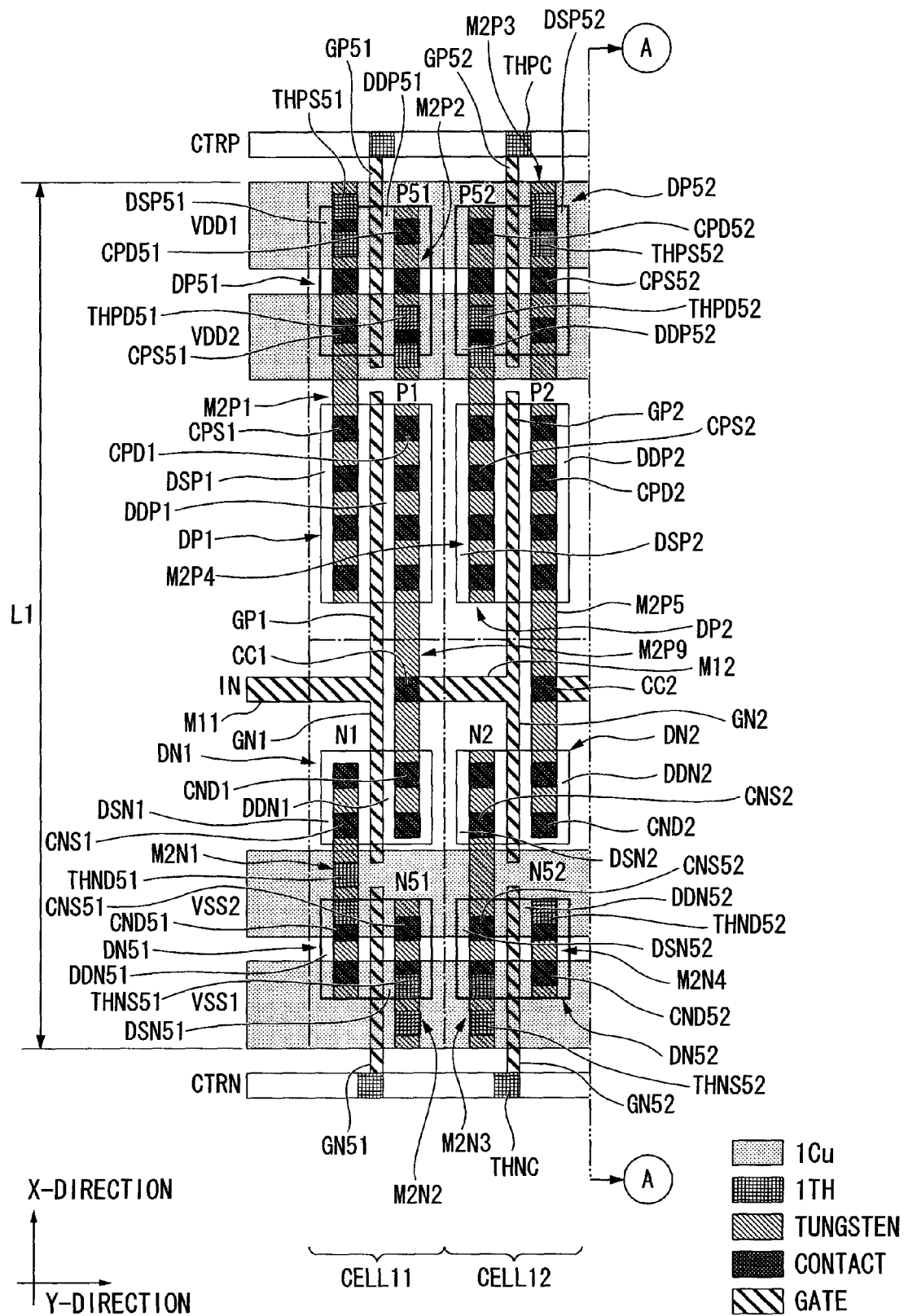
FIG. 5 is a diagram illustrating a layout on a semiconductor chip of the second power consumption circuit shown in FIG. 4.
Figure 6:
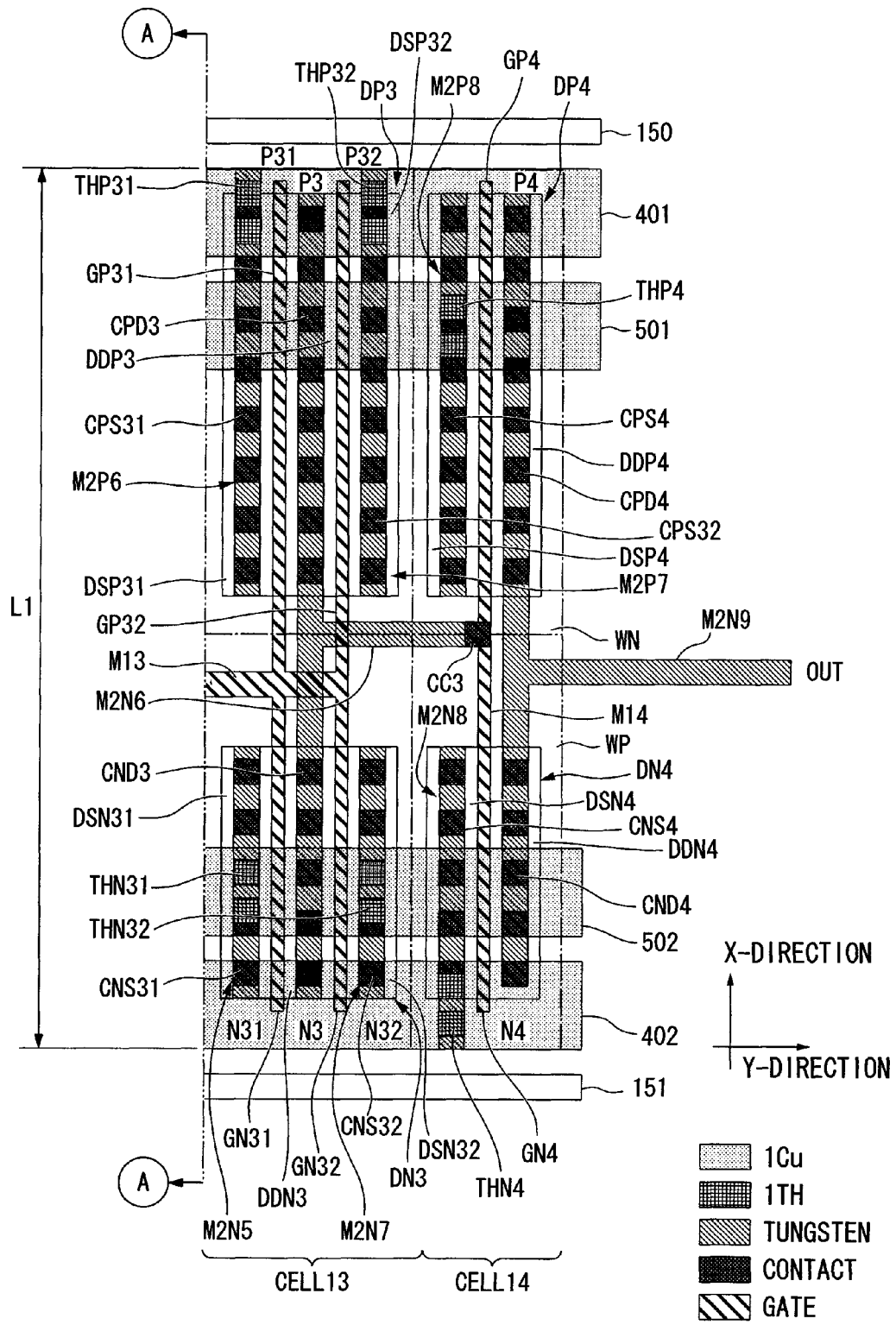
FIG. 6 is a diagram illustrating another layout on a semiconductor chip of the second power consumption circuit shown in FIG. 4.

FIG. 4 shows a series circuit of inverters IV1 to IV4 as an example of the second power consumption circuit formed in the cell areas A1, A2, A5, and A6 shown in FIG. 3. FIGS. 5 and 6 are diagrams illustrating a layout on a semiconductor chip of the second power consumption circuit shown in FIG. 4. The layouts in FIGS. 5 and 6 are connected to each other at the A plane on the plane surface.

As shown in FIG. 4, the inverters IV1 and IV3 are connected between the main power supply local line 401 and the sub-ground local line 502, respectively, and the inverters IV2 and IV4 are connected between the sub-power supply local line 501 and the main ground local line 402, respectively.

P-type transistors P51 and P52 are connected between the main power supply local line 401 and the sub-power supply local line 501 as a driver transistor included in the driver circuit H1, and N-type transistors N51 and N52 are connected between the main ground local line 402 and the sub-ground local line 502 as a driver transistor included in the driver circuit H2.

An interconnection of a control signal CTRP is supplied to gate electrodes of the driver transistors P51 and P52, and an interconnection of a control signal CTRN is connected to the gate electrodes of the driver transistors N51 and N52.

The control signal CTRP and the control signal CTRN are generated by a control circuit (not shown) provided to the semiconductor device, for example, for each second power consumption circuit in response to commands from the outside such as a command signal or an address signal, and are supplied as a control signal of a complementary voltage level.

When the second power consumption circuit shown in FIG. 4 is set to a standby state, this control circuit sets the control signal CTRP to an "H" level, and sets the control signal CTRN to an "L" level. When the second power consumption circuit shown in FIG. 4 is set to an active state, the control circuit sets the control signal CTRP to an "L" level, and sets the control signal CTRN to an "H" level. The control circuit detects whether to set a circuit block to any state of the standby state or the active state in response to the commands from the outside, and outputs the control signal CTRN and the control signal CTRP on the basis of the detect state.

As a result, at the time of the standby state, in each of an N-type transistor N1, a P-type transistor P2, an N-type transistor N3, a P-type transistor P4 which are a portion of the functional transistors in the inverters IV1, IV2, IV3 and IV4 and are connected to the sub-power supply local line or the sub-ground local line, the distances between gates and sources thereof are set to a reverse bias, thereby allowing the sub-threshold leakage current to be suppressed.

The second power consumption circuit shown in FIG. 4 is a circuit, at the time of the standby state, in which an input level which is a voltage level of the input signal in the input node of this circuit and an output level which is a voltage level of the output signal in the output terminal node of this circuit are fixed. Particularly, in the second power consumption circuit shown in FIG. 4, the input level and the output level are all fixed to an "L" level at the time of the standby state.

There is a configuration for setting into standby state such that the driver transistors P51 and P52, and the driver transistors N51 and N52 are set to an off-state, the second power supply potential VDD2 of the sub-power supply line 301 is fixed to a lower potential than that of the main power supply interconnection 201, and the second ground potential VSS2 of the sub-ground line 302 is fixed to a higher potential than the ground potential VDD1 of the main ground interconnection 202.

In this case, at the time of the standby state, each of the sub-power supply line and the sub-ground line may be newly provided with a power supply control circuit that supplies a voltage by which the previously set distance between the gate and the source is set to a reverse bias.

Reference is made to FIGS. 5 and 6 to describe the layout on the chip of the semiconductor device of the second power consumption circuit shown in FIG. 4. The layout arrangement in FIGS. 5 and 6 shows the configuration in which the layout arrangement of the circuit cells in the cell area A1 in FIG. 3 is rotated 90 degrees in the clockwise direction. Therefore, the X-direction (vertical direction in the drawing) and the Y-direction (horizontal direction in the drawing) in FIGS. 5 and 6 are rotated 90 degrees with respect to the X-direction (horizontal direction in the drawing) and the Y-direction (vertical direction in the drawing) in FIG. 3.

As shown in FIGS. 5 and 6, when the semiconductor device constituted by the circuit blocks having a predetermined function is created, the layout is formed by setting transistor groups included in each of the basic logic circuits, such as an inverter (inverting) circuit, a NAND (negative AND) circuit, a NOR (negative OR) circuit, as one collection unit, and each of the logic circuits is set to one cell. The circuit block is created for each predetermined function by combining these plural cells, and the semiconductor device is formed by combining these plural circuit blocks.

In FIGS. 5 and 6, the P-type transistor P1 and the N-type transistor N1 which are functional transistors included in the inverter IV1 of FIG. 4 are formed in a circuit cell CELL11.

The driver transistors P51 and N51 are further formed in this circuit cell CELL11.

The P-type transistor P2 and the N-type transistor N2 which are functional transistors included in the inverter IV2 of FIG. 4 are formed in a circuit cell CELL12. The driver transistors P52 and N52 are formed in this circuit cell CELL12.

The P-type transistor P3 and the N-type transistor N3 which are functional transistors included in the inverter IV3 of FIG. 4 are formed in a circuit cell CELL13.

The P-type transistor P4 and the N-type transistor N4 which are functional transistors included in the inverter IV4 of FIG. 4 are formed in a circuit cell CELL14.

The circuit block having circuit cells which include these circuit cells CELL11 to CELL14 is set to a circuit block 1.

In each of the circuit cells CELL11 to CELL14 lined up at the same cell area A1, the layout arrangement of FIGS. 5 and 6 is performed at the same dimension specified by the dimension (distance L1 in the X-direction of FIGS. 5 and 6) of the cell area for arranging the circuit cell. Preferably, the dimension of this circuit cell is the same as the greatest dimension of a plurality of circuit cells arranged in the same cell area A1.

Each of the circuit cells CELL11 to CELL14 is arranged in a line in the Y-direction of FIGS. 5 and 6. Each of these circuit cells CELL11 to CELL14 is formed to have individually different widths (lengths in the Y-direction) depending on the types of the logic circuits corresponding to each of the circuit cells or the sizes of the functional transistors included in each of the circuit cells.

Detailed descriptions will be made of the layout of each of the circuit cells in FIGS. 5 and 6.

The circuit cells CELL11 to CELL14 include an N-well region WN (P channel region) and a P-well region WP (N channel region), respectively, which are formed in a line in the X-direction, and a region in which the N-well region WN and the P-well region WP of each of the circuit cells are in contact with each other becomes a PN-isolation region.

A predetermined range of the P-type semiconductor substrate may be used as the P-well region, as it is, without forming the P-well region WP.

An active region DPI in which the P-type transistor P1 which is a functional transistor is formed, and an active region DP51 in which the driver transistor P51 is formed are formed in the N-well region WN of the circuit cell CELL11. In addition, an active region DN1 in which the N-type transistor N1 which is a functional transistor is formed, and an active region DN51 in which the driver transistor N51 is formed are formed in the P-well region WP of the circuit cell CELL11.

The active region DPI and the active region DP51 are arranged in a line in the X-direction within the N-well region WN of the circuit cell CELL11, and the active region DN1 and the active region DN51 are arranged in a line in the X-direction within the P-well region WP of the circuit cell CELL11.

Similarly, active regions DP2, DP52, DN2, and DP52 are formed in the circuit cell CELL12.

An active region DP3 in which the functional transistor P3 is formed is formed in the N-well region WN of the circuit cell CELL13, and an active region DN3 in which the functional transistor N3 is formed is formed in the P-well region WP.

Similarly, an active region DP4 in which the P-type transistor P4 is formed and an active region DN4 in which the N-type transistor N4 is formed are formed in the circuit cell CELL14.

The functional transistor P1 includes a gate electrode GP1 formed on the upper portion of the active region DPI with a gate insulating film interposed between the upper portion of the active region DPI and the gate electrode GP1.

A diffusion layer DSP1 as a diffusion layer (for example, source) of one side of the P-type transistor P1 and a diffusion layer DDP1 as a diffusion layer (for example, drain) of the other side thereof are formed in the active region DP1 in which the functional transistor P1 is formed. A region in the semiconductor substrate interposed between the diffusion layer DSP1 and the diffusion layer DDP1 forms a channel region (not shown). The gate electrode GP1 is formed on this channel region.

The functional transistors P2, P4, P51, and P52 have the same configuration as that of the P-type transistor P1 except for the size of the transistor. The functional transistors N1, N2, N4, N51, and N52 have the same configuration as that of the functional transistor P1 except for the conductivity type and the size thereof.

The functional transistor P3 includes one-sided diffusion layers DSP31 and DSP32 serving as a source in order to increase current drive capability. The functional transistor P3 may be realized by two P-type transistors P31 and P32 sharing a diffusion layer DDP3 serving as a drain. These two P-type transistors P31 and P32 include gate electrodes GP31 and GP32, respectively, formed on the upper portion of the diffusion region DP3 with a gate insulating film interposed between the gate electrodes GP31 and GP32 and the upper portion of the diffusion region DP3.

Similarly, the functional transistor N3 has the same configuration as that of the functional transistor P3 except for the conductivity type and the size thereof. The functional transistor N3 includes one-sided diffusion layers DSN31 and DSN32 serving as a source in order to increase current drive capability, and is constituted by two N-type transistors N31 and N32 sharing a diffusion layer DDN3 serving as a drain. These two N-type transistors N31 and N32 include gate electrodes GN31 and GN32, respectively, formed on the upper portion of the diffusion region DN3 with a gate insulating film interposed between the gate electrodes GN31 and GN32 and the upper portion of the diffusion region DN3.

Gate interconnections M11 to M14 are interconnections formed in the same first interconnection layer (gate interconnection layer denoted by M1*; the mark * is a symbol for identifying the interconnection). In addition, the gate electrodes GP1, GP2, GP31, GP32, GP4, GP51, GP52, GN1, GN2, GN31, GN32, GN4, GN51, and GN52 are also formed in the first interconnection layer. The gate interconnection M11 and the gate electrodes GP1 and GN1 are connected to each other. In addition, the gate interconnection M12 and the gate electrodes GP2 and GN2 are connected to each other. The gate interconnection M13 and the gate interconnections GP31, GP32, GN31 and GN32 are connected to each other.

A second interconnection layer (denoted by M2*; the mark * is a symbol for identifying the interconnection) is further formed on the upper portion of the first interconnection layer with a first interlayer insulating film interposed between the first and second interconnection layers.

As the second interconnection layer, a high melting point metal such as tungsten is used, and interconnections M2P1, M2P2, M2P3, M2P4, M2P5, M2P6, M2P7, and M2P8 and interconnections M2N1, M2N2, M2N3, M2N4, M2N5, M2N6, M2N7, M2N8, M2N8, and M2N9 are formed therein. A third interconnection layer is further formed on the upper portion of the second interconnection layer with a second interlayer insulating film interposed between the second and third interconnection layers. An interconnection M2P9 and the gate interconnection M12 are connected to each other with a contact CC1 interposed between. The interconnection M2P5 and the gate interconnection M13 are connected to each other through a contact CC2. The interconnection M2N6 and the gate interconnection M14 are connected to each other through a contact CC3.

As the third interconnection layer, metals such as copper (Cu) and aluminum (Al) are used, and the main power supply local line 401, the sub-power supply local line 501, the main ground local line 402, the sub-ground local line 502, an interconnection 150 of the control signal CTRP and an interconnection 151 of the control signal CTRN are formed therein. Here, the gate interconnection GP51 and the gate interconnection GP52 are connected to the interconnection 150 of the control signal CTRP through a through-hole THPC. In addition, the gate interconnection GN51 and the gate interconnection GN52 are connected to the interconnection 151 of the control signal CTRN through a through-hole THNC.

In the driver transistor P51, the interconnection M2P1 is connected to a diffusion layer (source) DSP51 through a contact CPS51, and the interconnection M2P2 is connected to a diffusion layer (drain) DDP51 through a contact CPD51. In addition, the interconnection M2P1 is connected to main power supply local line 401 through a through-hole THPS51. In addition, the interconnection M2P2 is connected to the sub-power supply local line 501 through a through-hole THPD51.

In the driver transistor P52, the interconnection M2P4 is connected to a diffusion layer (drain) DDP52 through a contact CPD52, and the interconnection M2P3 is connected to a diffusion layer (source) DSP52 through a contact CPS52. In addition, the interconnection M2P3 is connected to the main power supply local line 401 through a through-hole THPS52. The interconnection M2P4 is connected to the sub-power supply local line 501 through a through-hole THPD52.

In the functional transistor P1, the interconnection M2P1 is connected to the diffusion layer DSP1 of the diffusion layer (source) DPI through a contact CPS1, and the interconnection M2P9 is connected to the diffusion layer (drain) DDP1 through a contact CPD1.

In the functional transistor P2, the interconnection M2P4 is connected to a diffusion layer (source) DSP2 through a contact CPS2, and the interconnection M2P5 is connected to a diffusion layer (drain) DDP2 through a contact CPD2.

In the functional transistor P3, the interconnection M2P6 is connected to the diffusion layer (source) DSP31 of the P-type transistor P31 through a contact CPS31. The interconnection M2P7 is connected to the diffusion layer (source) DSP32 of the P-type transistor P32 through a contact CPS32. The interconnection M2N6 is connected to the diffusion layer (drain) DDP3 which the P-type transistors P31 and P32 share through a contact CPD3. The interconnection M2P6 is connected to the main power supply local line 401 through a through-hole THP31. The interconnection M2P7 is connected to the main power supply local line 401 through a through-hole THP32. Since the functional transistor P3 has a large width of the gate of the transistor, in the upper portion of the diffusion layer DP3, the gate electrode GP31 is formed between the interconnection M2P6 and the interconnection M2N6. The gate electrode GP32 is formed between the interconnection M2P7 and the interconnection M2N6.

In the functional transistor P4, the interconnection M2P8 is connected to a diffusion layer (source) DSP4 through a contact CPS4, and the interconnection M2N9 is connected to a diffusion layer (drain) DDP4 through a contact CPD4. The interconnection M2P8 is connected to the sub-power supply local line 501 through a through-hole THP4.

In the driver transistor N51, the interconnection M2N1 is connected to a diffusion layer (drain) DDN51 through a contact CND51, and the interconnection M2N2 is connected to a diffusion layer (source) DSN51 through a contact CNS51. The interconnection M2N1 is connected to the sub-ground local line 502 through a through-hole THND51. The interconnection M2N2 is connected to the main ground local line 402 through a through-hole THNS51.

In the driver transistor N52, the interconnection M2N3 is connected to a diffusion layer (source) DSN52 through a contact CNS52, and the interconnection M2N4 is connected to a diffusion layer (drain) DDN52 through a contact CND52. IThe interconnection M2N3 is connected to the main ground local line 402 through a through-hole THNS52. The interconnection M2N4 is connected to the sub-ground local line 502 through a through-hole THND52.

In the functional transistor N1, the interconnection M2N1 is connected to a diffusion layer (source) DSN1 through a contact CNS1, and the interconnection M2P9 is connected to a diffusion layer (drain) DDN1 through a contact CND1.

In the functional transistor N2, the interconnection M2N3 is connected to a diffusion layer (source) DSN2 through a contact CNS2, and the interconnection M2P5 is connected to a diffusion layer (drain) DDN2 through a contact CND2.

In the functional transistor N3, the interconnection M2N5 is connected to the diffusion layer (source) DSN31 of the N-type transistor N31 through a contact CNS31. The interconnection M2N7 is connected to the diffusion layer (source) DSN32 of the N-type transistor N32 through a contact CNS32. The interconnection M2N6 is connected to the diffusion layer (drain) DDN3 which the N-type transistors N31 and N32 share through a contact CND3. The interconnection M2N5 is connected to the sub-ground local line 502 through a through-hole THN31, and the interconnection M2N7 is connected to the sub-ground local line 502 through a through-hole THN32. In correspondence to the P-type transistor P3, the N-type transistor N3 has a large width of the gate of the transistor. In the upper portion of the diffusion layer DN3, the gate electrode GN31 is formed between the interconnection M2N5 and the interconnection M2N6. The gate electrode GN32 is formed between the interconnection M2N7 and the interconnection M2N6.

In the functional transistor N4, the interconnection M2N8 is connected to a diffusion layer (source) DSN4 through a contact CNS4, and the interconnection M2N9 is connected to a diffusion layer (drain) DDN4 through a contact CND4. The interconnection M2N8 is connected to the main ground local line 402 through a through-hole THN4.

The functional transistor P1 and the driver transistor P51 are arranged in a line in the X-direction in the N-well region WN within the circuit cell CELL11. Preferably, in the N-well region WN of the circuit cell CELL11, the functional transistor P1 is arranged between the driver transistor P51 and the PN-isolation region.

The functional transistor N1 and the driver transistor N51 in the circuit cell CELL11, the functional transistor P2 and the driver transistor P52 in the circuit cell CELL12, and the functional transistor N2 and the driver transistor N52, respectively, are also arranged in the same positional relationship as that of the functional transistor P1 and the driver transistor P52 mentioned above.

Each of the contacts is formed in the first interlayer insulating film. Each of the through-holes is formed in the second interlayer insulating film.

Through the above-mentioned connection, the driver transistor P51 included in the driver circuit that connects the main power supply local line 401 and the sub-power supply local line 501 is formed in a region (functional-element-free region), in which the functional transistor P1 is not formed, in the N-well WN of the circuit cell CELL11. The functional-element-free region is a region in which no functional elements are formed. The functional-element-free region is free of any functional elements. The functional-element operates when the current reduction circuit is in an active state. After the functional transistor P1 is formed, the transistor having a size capable of being created in a region formed within the circuit cell CELL11 is formed as the driver transistor P51 on the basis of the transistor size of this functional transistor P1.

Similarly, the driver transistors P52, N51, and N52 are formed as transistors having a size capable of being created in the functional-element-free region of the circuit cell in which each of them is formed.

Therefore, the semiconductor device includes the first power supply line (main power supply local line). The semiconductor device includes the second power supply line (main ground local line). The first and second power supply lines extend in the first direction (Y-direction). The semiconductor device includes a plurality of circuit cells (circuit cells CELL11 to circuit cell 14), arranged in a row in the first direction. The plurality of circuit cells each includes a first region of a first conductivity type. The first region may be for example, a region including the well WN or the well WP of the circuit cell surrounded by the main power supply local line 401 and the main ground local line 402), and the first and second diffusion layers and the gate electrode. The semiconductor device includes a plurality of first transistors (functional transistors P1 and P3) arranged in the first region of a portion of the circuit cell of a plurality of circuit cells. The semiconductor device includes a plurality of second transistors (functional transistors P2 and P4). The first and second transistors each include the first and second diffusion layers and the gate electrode, which is arranged in the first region of the remaining circuit cell of a plurality of circuit cells, and the first and second diffusion layers and the gate electrode. The semiconductor device includes the third transistors (driver transistors P51 and P52) arranged in the first region of at least one circuit cell (circuit cell CELL11) of a plurality of circuit cells. The semiconductor device includes a plurality of first interconnection layers (M2P1 and M2P8) that connects any one of the first and second diffusion layers of a plurality of first transistors and the first power supply line. The semiconductor device includes a plurality of second interconnection layers (M2P4, M2P6, and M2P7) that connects any one of the first and second diffusion layers of a plurality of second transistors and the second power supply line. The semiconductor device includes a plurality of third interconnection layers (M2P1 and M2P3) that connects any one of the first and second diffusion layers of a plurality of third transistors and the first power supply line. The semiconductor device includes a plurality of fourth interconnection layers (M2P2 and M2P4) that connects any other one of the first and second diffusion layers of a plurality of third transistors and the second power supply line.

When the circuit cells are formed, the width of the circuit cell is changed by the types of the logic circuits corresponding to each of the circuit cells or the sizes of the transistors included in each of the circuit cells. Since the dimensions of the circuit cells are constant, the functional-element-free region is often generated in the dimension direction of the circuit cell by the size of the transistor to be formed.

Since the circuit cells are formed to have a constant dimension L1, the driver transistor included in the driver circuit that connects the main power supply local line and the sub-power supply local line, or the driver transistor included in the driver circuit that connects the main ground local line and the sub-ground local line is formed in the functional-element-free region generated in a case where transistors smaller than other circuit cells are formed.

For this reason, in the semiconductor device including the second power consumption circuit having a power shutdown configuration that reduces the sub-threshold leakage current to decrease power consumption at the time of the standby, it is possible to suppress to a minimum an increase in the area of the semiconductor device by adding the driver circuit for controlling the second power supply potential.

Second Embodiment

Figure 7:
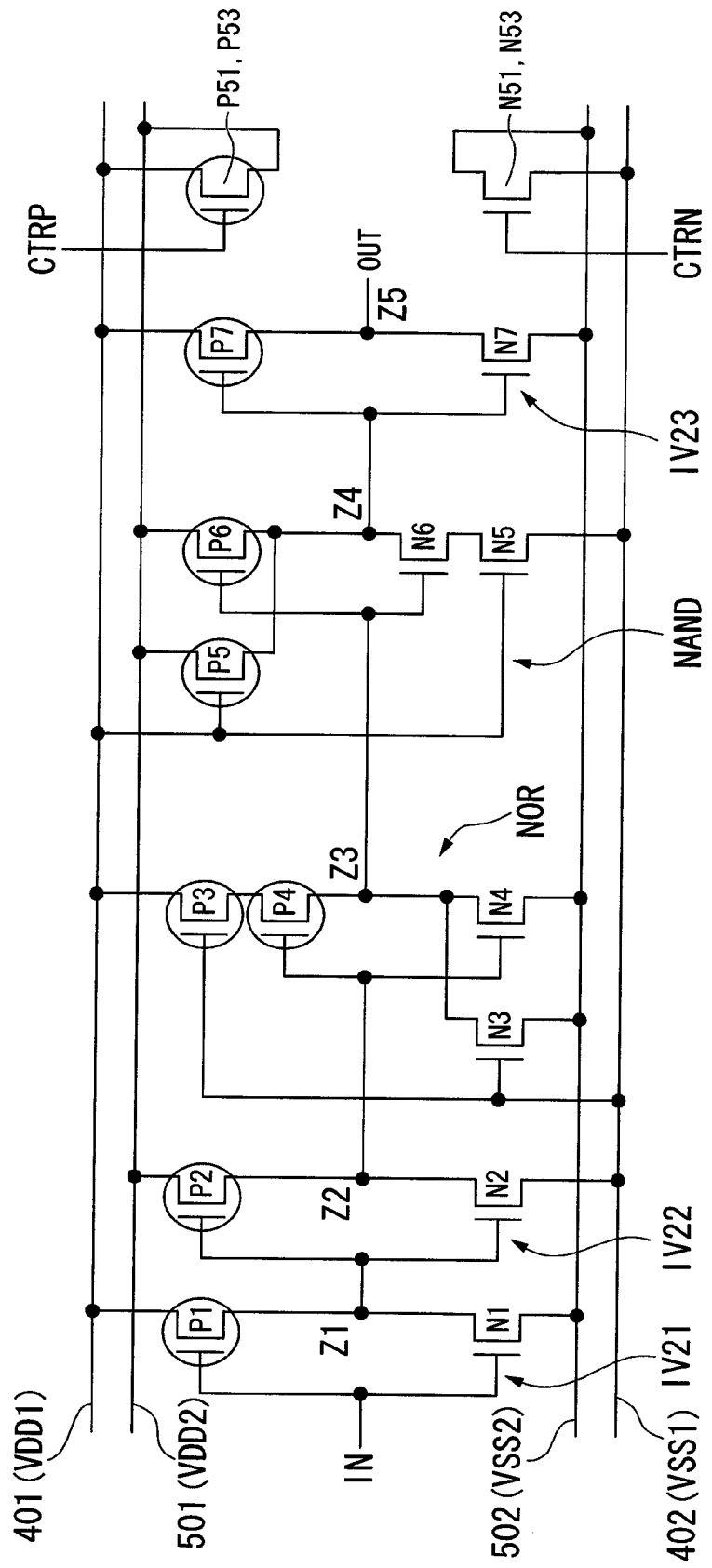
FIG. 7 is a circuit diagram illustrating another example of the second power consumption circuit formed in the cell areas A1, A2, A5, and A6 of FIG. 3.
Figure 8:
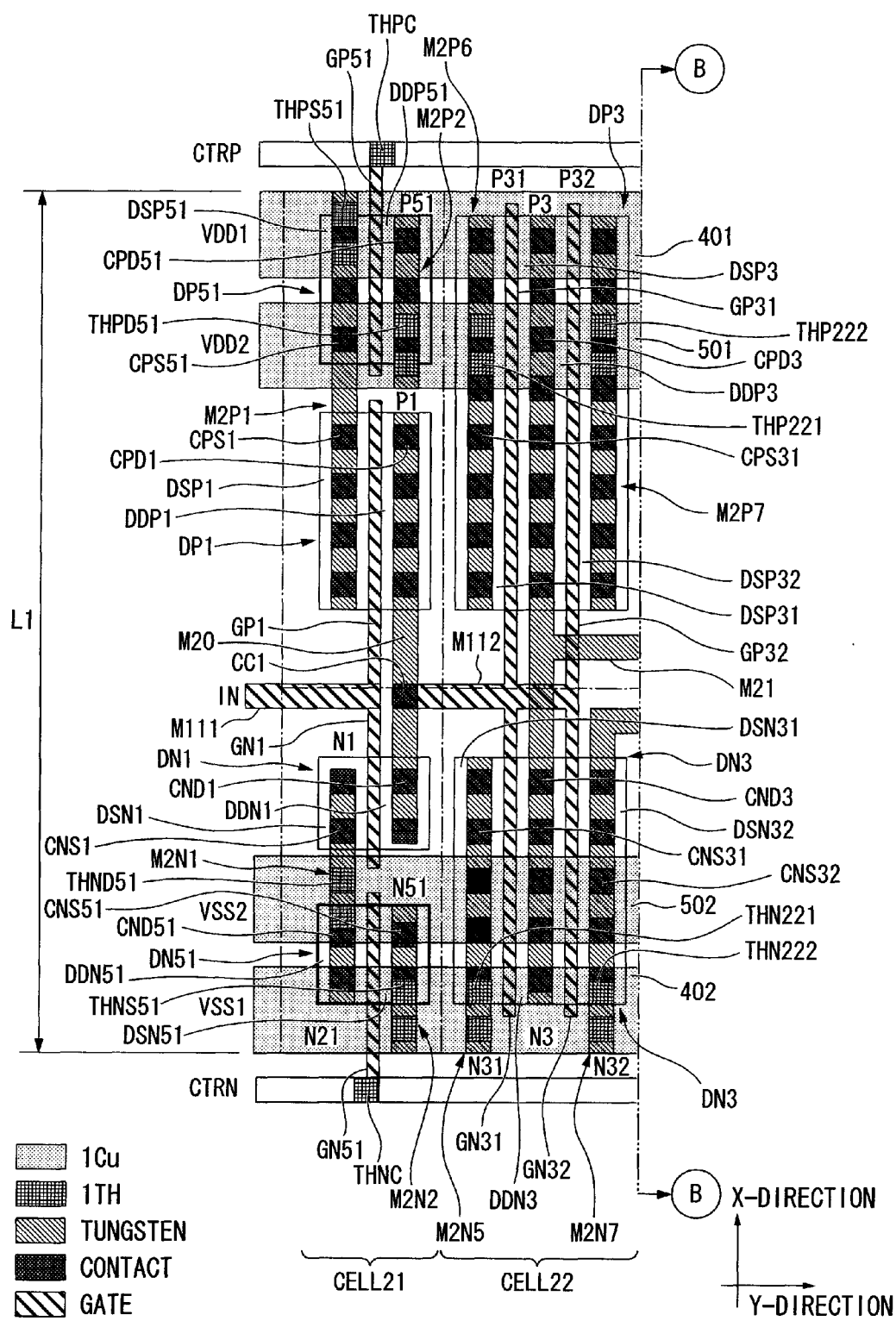
FIG. 8 is a diagram illustrating a layout on a chip of the second power consumption circuit shown in FIG. 7.
Figure 9:
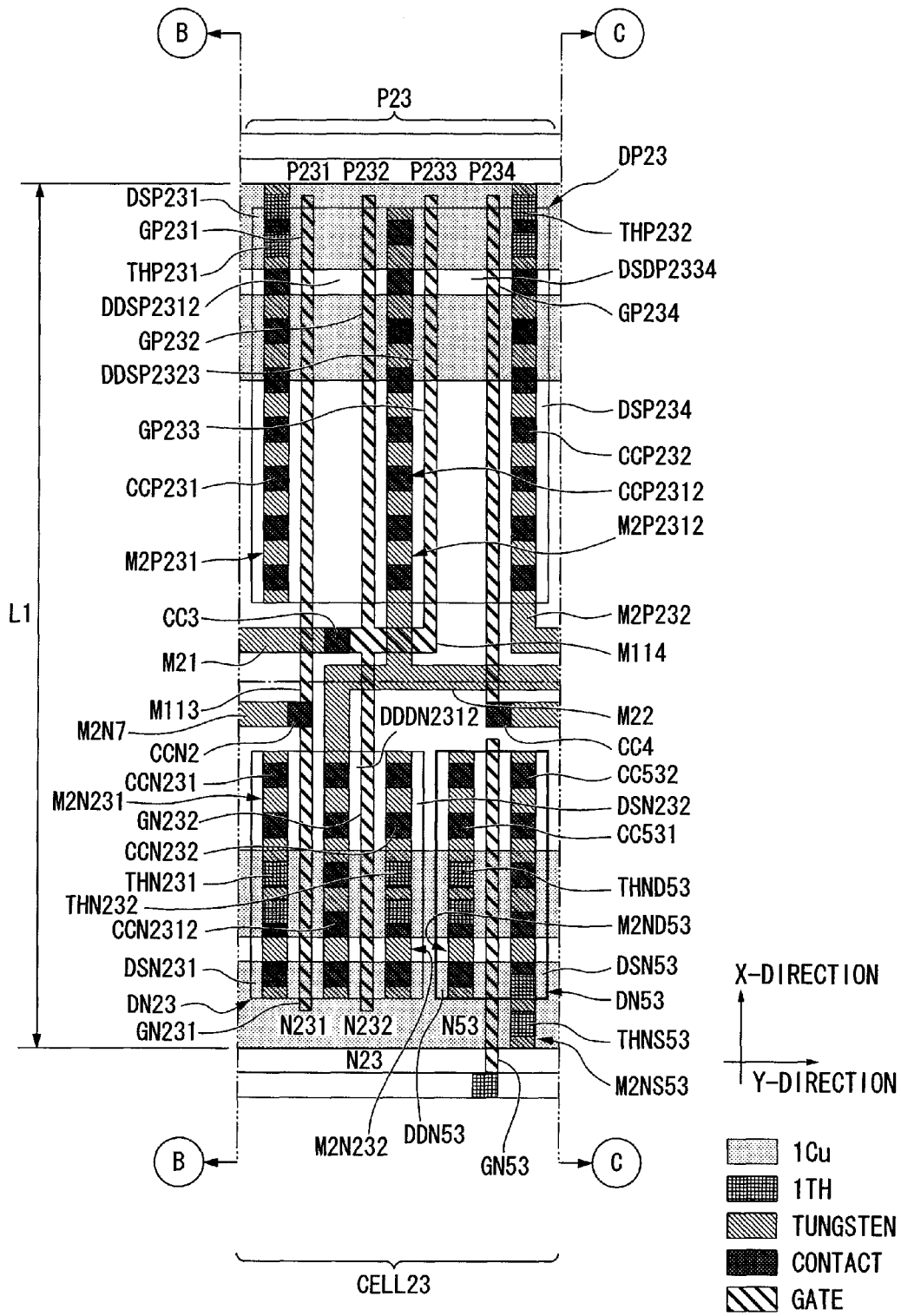
FIG. 9 is a diagram illustrating another layout on the chip of the second power consumption circuit shown in FIG. 7.
Figure 10:
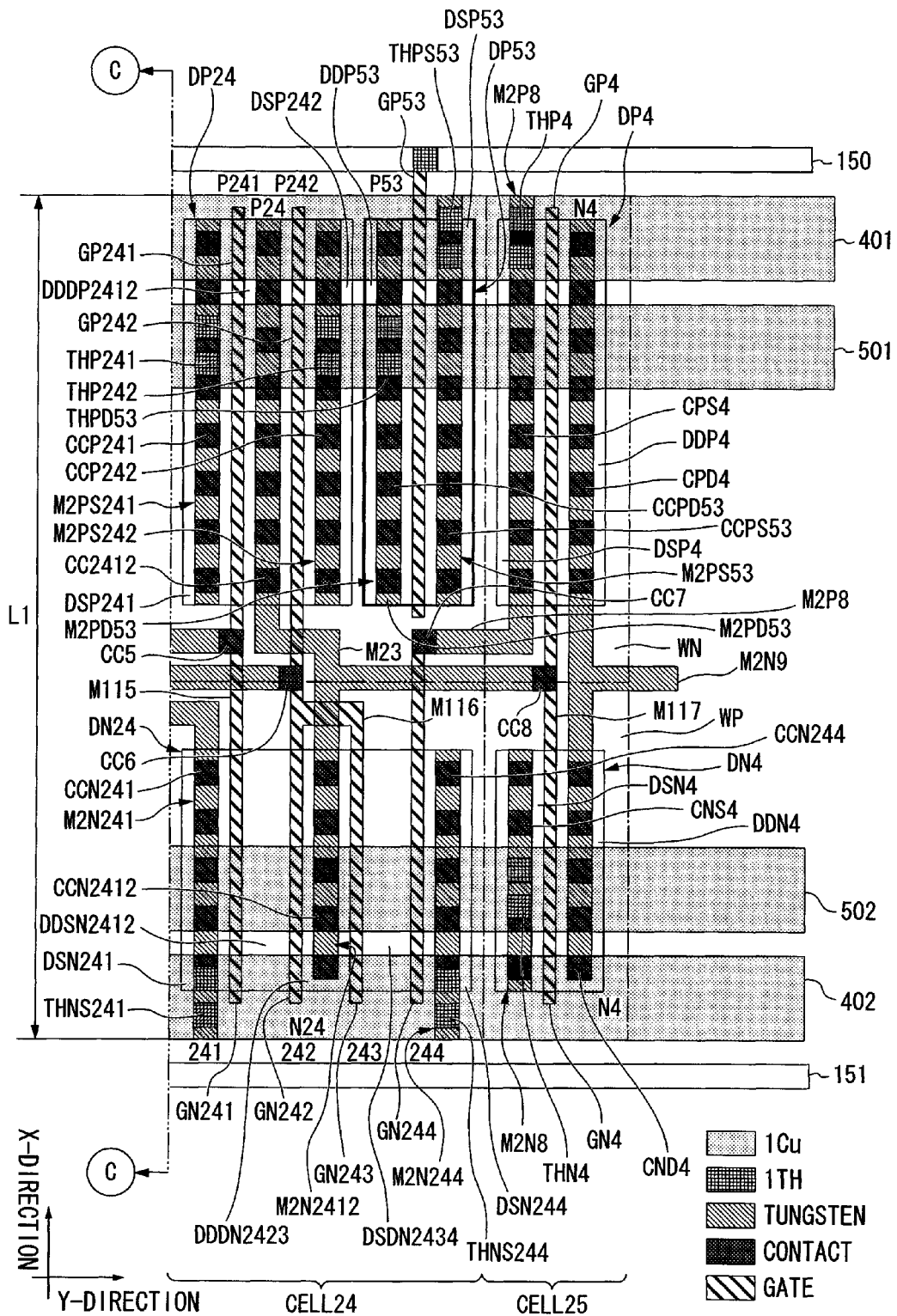
FIG. 10 is a diagram illustrating still another layout on the chip of the second power consumption circuit shown in FIG. 7.

FIG. 7 is a circuit diagram illustrating another example of the second power consumption circuit formed in the cell areas A1, A2, A5, and A6 of FIG. 3. Specifically, FIG. 7 shows the configuration of a circuit in which inverters IV21, IV22, NOR, NAND and IV23 are series-connected. In addition, FIGS. 8, 9 and 10 are diagrams illustrating the layout on the chip of the semiconductor device of the second power consumption circuit shown in FIG. 7.

The second power consumption circuit shown in FIG. 7 is different from the viewpoint that it includes not only the inverters but also the logic circuits such as a NAND circuit or a NOR circuit compared to the second power consumption circuit of the first embodiment shown in FIG. 4.

As shown in FIG. 7, the inverters IV21 and IV23 and the NOR circuit NOR are connected between the main power supply local line 401 and the sub-ground local line 502, and the inverter IV22 and the NAND circuit NAND are connected between the sub-power supply local line 501 and the main ground local line 402.

The NOR circuit NOR substantially functions as an inverter by connecting a one-side input terminal thereof to the main ground local line 402, and the NAND circuit NAND substantially functions as an inverter by connecting a one-side input terminal thereof to the main power supply local line.

The P-type transistors P51 and P53 as the driver transistors included in the driver circuit H1 are arranged between the main power supply local line 401 and the sub-power supply local line 501, and the N-type transistors N51 and N53 as the driver transistors included in the driver circuit H2 are connected between the main ground local line 402 and the sub-ground local line 502. Meanwhile, the operations of each of the driver transistors P51, P53, N51 and N53 are respectively the same as those of the driver transistors P51 and P52 and the driver transistors N51 and N52 of the first embodiment.

The second power consumption circuit shown in FIG. 7 is a circuit, at the time of the standby state, in which an input level which is a voltage level of the input signal in the input node of this circuit and an output level which is a voltage level of the output signal in the output terminal node of this circuit are fixed. Particularly, in the second power consumption circuit shown in FIG. 4, at the time of the standby state, the input level is fixed to an "L" level, and the output level is fixed to an "H" level, respectively.

Reference is made to FIGS. 8, 9 and 10 to describe the layout on the chip of the semiconductor device of the circuit in which the inverters IV21 and IV22, the NOR circuit NOR, the NAND circuit NAND, and the inverter IV23 in FIG. 7 are series-connected. The layout arrangement of FIGS. 8, 9 and 10 shows the configuration in which the layout arrangement of the circuit cell in the cell area A1 in FIG. 3 is rotated 90 degrees in a clockwise direction. Therefore, the X-direction (vertical direction in the drawing) and the Y-direction (horizontal direction in the drawing) in FIGS. 8, 9 and 10 are rotated 90 degrees with respect to the X-direction (horizontal direction in the drawing) and the Y-direction (vertical direction in the drawing) in FIG. 3.

In FIGS. 8, 9 and 10, the configuration within the circuit cell of a circuit cell CELL21 in which the inverter circuit W21 is formed has the same configuration as that of the circuit cell CELL11 shown in FIGS. 5 and 6. The configuration within the circuit cell of a circuit cell CELL25 in which the inverter circuit IV23 is formed is the same as that of a circuit cell CELL24 shown in FIGS. 5 and 6, and thus in order to avoid repeated description, like elements are referenced by like reference numerals and description thereof will be omitted herein.

The configuration within the circuit cell of a circuit cell CELL22 in which the inverter circuit IV22 is formed is only different, compared to the configuration of the circuit cell CELL13 shown in FIGS. 5 and 6, in view of the followings. A through-hole THP221 that connects the connection M2P6 and the sub-power supply local line 501 is arranged in place of the through-hole THP31 that connects the interconnection M2P6 and the main power supply local line 401. A through-hole THP222 that connects the interconnection M2P7 and the sub-power supply local line 501 is arranged in place of the through-hole THP32 that connects the interconnection M2P7 and the main power supply local line 401. A through-hole THN221 that connects the interconnection M2N5 and the main ground local line 402 is arranged in place of the through-hole THN31 that connects the interconnection M2N5 and the sub-ground local line 502. A through-hole THN222 that connects the interconnection M2N7 and the main ground local line 402 is arranged in place of the through-hole THN32 that connects the interconnection M2N7 and the sub-ground local line 502. Therefore, elements other than the through-holes THP221, THP222, THN221, and THN222 in the circuit cell CELL22 are referenced by the same reference numerals as those of the elements of the circuit cell CELL13 in FIGS. 5 and 6 and description thereof will be omitted.

Hereinafter, there will be described in detail a circuit cell CELL23 in which the NOR circuit NOR is formed and the circuit cell CELL24 in which the NAND circuit NAND is formed.

The N-type transistor N53 as a driver transistor is formed in the circuit cell CELL23, in addition to a P-type transistor P23 and an N-type transistor N23 which are functional transistors included in the NOR circuit of FIG. 7.

The P-type transistor P53 as a driver transistor is formed in the circuit cell CELL24, in addition to a P-type transistor P24 and an N-type transistor N24 which are functional transistors included in the NAND circuit of FIG. 7.

Similarly to the first embodiment, in each of the circuit cells CELL21 to CELL25 lined up at the same cell area A1, the layout arrangement of FIGS. 8, 9 and 10 is performed at the same dimension (distance L1 in the X-direction of FIGS. 8, 9 and 10) specified by the dimension (distance L1 in the X-direction of FIGS. 8, 9 and 10) of the cell area for arranging the circuit cell. Preferably, the dimension of this circuit cell is the same as the greatest dimension of a plurality of circuit cells arranged in the same cell area A1.

Each of the circuit cells CELL21 to CELL25 is arranged in a line in the Y-direction of FIGS. 8, 9 and 10. These circuit cells CELL21 to CELL25 are formed to have different widths (lengths in the Y-direction) depending on the types or the logic circuits corresponding to the sizes of the transistors included in each of the circuit cells or the sizes of the functional transistors included in each of the circuit cells.

The circuit cells CELL23 and CELL24 include the N-well region WN, the P-well region WP, and the PN-isolation region, similarly to the circuit cells CELL11 to CELL14 shown in FIGS. 5 and 6 and the circuit cells CELL21, CELL22, and CELL25 shown in FIGS. 8, 9 and 10. As previously described, a predetermined range of the P-type semiconductor substrate may be used as the P-well region as it is, without forming the P-well region WP.

An active region DP23 in which the P-type transistor P23 which is a functional transistor is formed is formed in the N-well region WN of the circuit cell CELL23. An active region DN23 in which the N-type transistor N23 which is a functional transistor is formed and an active region DN53 in which the driver transistor N53 is formed are formed in the P-well region WP of the circuit cell CELL23.

The active region DN23 and the active region DN53 are arranged in a line in the Y-direction within the P-well region WP of the circuit cell CELL23.

The functional transistor P23 includes a plurality of P-type transistors P231, P232, P233, and P234.

The P-type transistor P231 includes a gate electrode GP231 formed on the upper portion of the active region DP23 with a gate insulating film interposed between the gate electrode GP231 and the active region DP23.

The P-type transistors P232, P233, and P234 include gate electrodes GP232, GP233, and GP234 formed on the upper portion of the active region DP23 with a gate insulating film interposed between the gate electrodes GP232, GP233, and GP234 and the active region DP23.

Diffusion layers DSP231, DDSP2312, DDDP2323, DSDP2334, and DSP234 are formed in the active region DP23 as diffusion layers of each of the P-type transistors P231, P232, P233, and P234. Regions in the semiconductor substrate which are interposed between the adjacent formed diffusion layers form the channel regions (not shown), respectively. The gate electrodes GP231, GP232, GP233, and GP234 are formed on the corresponding channel regions.

The P-type transistor P231 and the P-type transistor P232 share the diffusion layer DDSP2312, the P-type transistor P232 and the P-type transistor P233 share the diffusion layer DDDP2323, and the P-type transistor P233 and the P-type transistor P234 share the diffusion layer DSDP2334.

The functional transistor N23 includes a plurality of N-type transistors N231 and N232.

The N-type transistor N231 includes a gate electrode GN231 formed on the upper portion of the active region DN23 with a gate insulating film interposed between the gate electrode GN231 and the active region DN23.

Similarly, the N-type transistor N232 includes a gate electrode GN232, and the driver transistor N53 includes a gate electrode GN53 formed on the active region DN53.

Diffusion layers DSN231, DDDN231, and DSN232 are formed in the active region DN23 as diffusion layers of each of the N-type transistors N231 and N232. Regions in the semiconductor substrate which are interposed between the adjacent formed diffusion layers of these diffusion layers form the channel regions (not shown), respectively. The gate electrodes GN231 and GN232 are formed on the corresponding channel regions.

The N-type transistor N231 and the N-type transistor N232 share a diffusion layer DDDN2312.

Diffusion layers DSN53 and DDN53 as diffusion layers of the driver transistor N53 are formed in the active region DN53. Regions in the semiconductor substrate which are interposed between the diffusion layer DSN53 and the diffusion layer DDN53 form the channel regions (not shown), respectively. The gate electrode GN53 is formed on the channel region.

The NOR circuit of the embodiment is configured such that two P-type transistor sections are parallel-connected in which the P-type transistors P3 and P4 are series-connected in the circuit diagram of FIG. 7. Each of two P-type transistors P231 and P232 and P-type transistors P233 and P234 is series-connected in the layout of FIGS. 8, 9 and 10. This is to set current drive capability of the transistors in the P-type transistor side and the N-type transistor side of the functional transistor in the circuit diagram of FIG. 7. As a result, in the circuit cell CELL23, a functional-element-free region is generated in a region adjacent to the Y-direction in the active region DN23 of the P-type well WP. In the embodiment, the active region DN53 is formed in this functional-element-free region, and the driver transistor N53 is arranged therein.

The active region DP23 in which the P-type transistor P24 which is a functional transistor is formed and an active region DP53 in which the driver transistor P53 is formed are formed in the N-well region WN of the circuit cell CELL24. The active region DN23 in which the N-type transistor N24 which is a functional transistor is formed is formed in the P-well region WP of the circuit cell CELL23.

The active region DP24 and the active region DP53 are arranged in a line in the Y-direction within the N-well region WN of the circuit cell CELL24.

The functional transistor P24 includes P-type transistors P241 and P242.

The P-type transistor P241 includes a gate electrode GP241 formed on the upper portion of the active region DP24 with an insulating film interposed between.

Similarly, the P-type transistor P242 includes a gate electrode GP242 formed on the upper portion of the active region DP24 with an insulating film interposed between.

Diffusion layers DSP241, DDDP2412, and DSP242 as diffusion layers of each of the P-type transistors P241 and P242 are formed in the active region DP24. Regions in the semiconductor substrate which are interposed between the adjacent formed diffusion layers of these diffusion layers form the channel regions (not shown), respectively. The gate electrodes GP241 and GP242 are formed on the corresponding channel regions.

The P-type transistor P241 and the P-type transistor P242 share the diffusion layer DDDP2412.

Diffusion layers DSP53 and DDP53 as diffusion layers of the driver transistor P53 are formed in the active region DP53. Regions in the semiconductor substrate which are interposed between the diffusion layer DSP53 and the diffusion layer DDP53 form the channel regions (not shown), respectively. A gate electrode GP53 is formed on the channel region.

The functional transistor N24 includes a plurality of N-type transistors N241, N242, N243, and N244.

The N-type transistor N241 includes a gate electrode GN241 formed on the upper portion of an active region DN24 with an insulating film interposed between the gate electrode GN241 and the active region DN24.

Similarly, the N-type transistors N242, N243, and N244 includes gate electrodes GN242, GN243, and GN244 formed on the upper portion of the active region DN24 with an insulating film interposed between the gate electrodes GN242, GN243, and GN244 and the active region DN24.

Diffusion layers DSN241, DDSN2412, DDDN2423, DSDN2434, and DSN244 as diffusion layers of each of the N-type transistors N241, N242, N243, and N244 are formed in the active region DN24. Regions in the semiconductor substrate which are interposed between the adjacent formed diffusion layers form the channel regions (not shown), respectively. The gate electrodes GN241, GN242, GN243, and GN244 are formed on the corresponding channel regions.

The N-type transistor N241 and the N-type transistor N242 share the diffusion layer DDSN2412, the N-type transistor N242 and the N-type transistor N243 share the diffusion layer DDDN2423, and the N-type transistor N243 and the N-type transistor N244 share the diffusion layer DSDN2434.

In this manner, the NAND circuit of the embodiment is configured such that two N-type transistor sections are parallel-connected in which the N-type transistors N5 and N6 are series-connected in the circuit diagram of FIG. 7. Each of two N-type transistors N241 and N242 and N-type transistors N243 and N244 is series-connected in the layout of FIGS. 8, 9 and 10. This is to set current drive capability of the transistors in the P-type transistor side and the N-type transistor side of the functional transistor in the circuit diagram of FIG. 7. As a result, in the circuit cell CELL24, a functional-element-free region is generated in a region adjacent to the Y-direction in the active region DP24 of the N-type well WP.

In the embodiment, the active region DP53 is formed in this functional-element-free region, and the driver transistor P53 is formed in this region.

Descriptions will be made of the connection relationship of the interconnections in the layout of the circuit in FIGS. 8, 9 and 10.

Gate interconnections M111, M112, M113, M114, M115, M116 and M117 are gate interconnection layers formed in the same first interconnection layer. The gate electrodes GP1, GP4, GP31, GP32, GP51, GP53, GP231, GP232, GP233, GP234, GP241, and GP242, and the gate electrodes GN1, GN4, GN31, GN32, GN51, GN53, GN231, GN232, GN241, GN242, GN243, and GN244 are also formed in the same first interconnection layer.

The gate interconnection M111, and the gate electrodes GP1 and the gate electrode GN1 are connected to each other.

The gate interconnection M112, and the gate electrodes GP31, GP32, GN31 and GN32 are connected to each other. The gate interconnection M113, and the gate electrodes GP231 and GN231 are connected to each other. The gate interconnection M114, and the gate electrodes GP232, GP233 and GN53 are connected to each other. The gate interconnection M115, and the gate electrodes GP241 and GN241 are connected to each other. The gate interconnection M116, and the gate electrodes GP242, GN242 and GN243 are connected to each other. The gate interconnection M117, and the gate electrodes GP4 and GN4 are connected to each other.

The second interconnection layer is further formed on the upper portion of the first interconnection layer with the first interlayer insulating film interposed between the first and second interconnection layers. A contact for connecting the interconnections of the first interconnection layer and the second interconnection layer is formed in the first interlayer insulating film.

As the second interconnection layer, a high melting point metal such as tungsten is used, and interconnections M20, M21, M22, and M23, interconnections M2P1, M2P2, M2P6, M2P7, M2P8, M2P231, M2P232, M2PS241, M2PS242, M2PD53, and M2PS53, and interconnections M2N1, M2N2, M2N5, M2N7, M2N8, M2NS53, M2ND53, M2N241, M2N2412, M2N244, and M2N9 are formed therein. The third interconnection layer is further formed on the upper portion of the second interconnection layer with the second interlayer insulating film interposed between the second and third interconnection layers. A through-hole for connecting the interconnections of the second interconnection layer and the third interconnection layer is formed in the second interlayer insulating film.

The interconnection M20 and the gate interconnection M112 are connected to each other through the contact CC1. The interconnection M2N7 and the gate interconnection M113 are connected to each other through the contact CC2. The interconnection M21 and the gate interconnection M114 are connected to each other through the contact CC3. The interconnection M2N241 and the gate electrode 234 are connected to each other through a contact CC4. The interconnection M2P232 and the gate interconnection M115 are connected to each other through a contact CC5. The interconnection M22 and the gate interconnection M116 are connected to each other through a contact CC6. The interconnection M2P8 and the gate electrode GN244 are connected to each other through a contact CC7. The interconnection M23 and the gate interconnection M117 are connected to each other through a contact CC8. As described above, the contact is formed in the first interlayer insulating layer, and the through-hole is formed in the second interlayer insulating layer.

Similarly to the first embodiment, metals such as copper and aluminum are used as the third interconnection layer, and the main power supply local line 401, the sub-power supply local line 501, the main ground local line 402, the sub-ground local line 502, the interconnection 150 of the control signal CTRP and the interconnection 151 of the control signal CTRN are formed therein. Here, the gate electrode GP51 and the gate electrode GP53 are connected to the interconnection 150 of the control signal CTRP through the through-hole THPC. In addition, the gate electrode GN51 and the gate electrode GN53 are connected to the interconnection 151 of the control signal CTRN through the through-hole THNC.

The driver transistors P51 and N51, the functional transistor P1 and the functional transistor N2 in the circuit cell CELL21 have the same configurations as those of each of the transistors of the circuit cell CELL11 in the first embodiment.

The configurations of the transistor P3 and the transistor N3 of the circuit cell CELL22 are also the same as those of the circuit cell CELL13 in the first embodiment. The configuration of the functional transistor P3 is different from that of the first embodiment in the following points of view. The interconnection M2P6 is connected to the sub-power supply local line 501 through the through-hole THP221. The interconnection M2P7 is connected to the sub-local line 501 through the through-hole THP222. The interconnection M2N5 is connected to the main ground local line 402 through the through-hole THN221. The interconnection M2N7 is connected to the main ground local line 402 through the through-hole THN222. The interconnection M21 is connected to the diffusion layer (drain) DDP3 of the functional transistor P3 through the contact CPD3. The interconnection M21 is connected to the diffusion layer (drain) DDN3 of the functional transistor N3 through the contact CND3.

In the functional transistor P23, the interconnection M2P231 is connected to the diffusion layer (source) DSP231 of the P-type transistor P231 through a contact CCP231. The interconnection M22 is connected to a diffusion layer (drain) DDSP2323 which the P-type transistors P232 and P233 share through a contact CCP2312. The interconnection M2P232 is connected to the diffusion layer (source) DSP234 of the P-type transistor 234 through a contact CCP232. The diffusion layer DDSP2312 is formed as a drain of the P-type transistor P231. The diffusion layer DDSP2312 is shared as a source of the P-type transistor P232. Similarly, the diffusion layer DSDP2334 is formed as a drain of the P-type transistor P234, and is shared as a source of the P-type transistor 233. The interconnection M2P231 is connected to the main power supply local line 401 through a through-hole THP231.

The interconnection M2P232 is connected to the main power supply local line 401 through a through-hole THP232.

In the functional transistor N23, an interconnection M2N231 is connected to the diffusion layer (source) DSN231 of the N-type transistor N231 through a contact CCN231. The interconnection M22 is connected to the diffusion layer (drain) DDDN2312 which the N-type transistors N231 and N232 share through a contact CCN2312. An interconnection M2N232 is connected to the diffusion layer (source) DSN232 of the N-type transistor N232 through a contact CCN232. The interconnection M2N232 is connected to the sub-ground local line 502 through a through-hole THN232. The interconnection M2N231 is connected to the diffusion layer (source) DSN231 of the N-type transistor N231 through the contact CCN231, and is connected to the sub-ground local line 502 through a through-hole THN231.

In the driver transistor N53 of the N-type transistor, the interconnection M2ND53 is connected to the diffusion layer (drain) DDN53 through a contact CC531, and the interconnection M2NS53 is connected to the diffusion layer (source) DSN53 through a contact CC532. The interconnection M2ND53 is connected to the sub-ground local line 502 through a through-hole THND53. The interconnection M2NS53 is connected to the main ground local line 402 through a through-hole THSN53.

In the functional transistor P24, the interconnection M2PS241 is connected to the diffusion layer (source) DSP241 of the P-type transistor P241 through a contact CCP241. The interconnection M23 is connected to the diffusion layer (drain) DDDP2412 which the P-type transistors P241 and P242 share through a contact CC2412. An interconnection M2P242 is connected to the diffusion layer (source) DSP242 of the P-type transistor P242 through a contact CCP242. The interconnection M2PS241 is connected to the sub-power supply local line 501 through a through-hole THP241. The interconnection M2PS242 is connected to the sub-power supply local line 501 through a through-hole THP242.

In the functional transistor N24, the interconnection M2N241 is connected to the diffusion layer (source) DSN241 of the N-type transistor N241 through a contact CCN241. The interconnection M23 is connected to the diffusion layer (drain) DDDN2423 which the N-type transistors N242 and N243 share through a contact CCN2412. The interconnection M2N244 is connected to the diffusion layer (source) DSN244 of the N-type transistor N244 through a contact CCN244. The diffusion layer DDSN2412 is formed as a drain of the N-type transistor N241, and is shared as a source of the N-type transistor N242. The diffusion layer DSDN2434 is formed as a source of the N-type transistor 243, and is shared as a drain of the N-type transistor N244. The interconnection M2N241 is connected to the main ground local line 402 through a through-hole THNS241. The interconnection M2N244 is connected to the main ground local line 402 through a through-hole THNS244.

In the driver transistor P53 of the P-type transistor, the interconnection M2PD53 is connected to the diffusion layer (drain) DDP53 through a contact CCPD53. The interconnection M2PS53 is connected to the diffusion layer (source) DSP53 through a contact CCPS53. The interconnection M2PD53 is connected to the sub-power supply local line 501 through a through-hole THPD53. The interconnection M2PS53 is connected to the main power supply local line 401 through a through-hole THPS53.

The driver transistors P4 and N4, the functional transistor P1 and the functional transistor N2 in the circuit cell CELL25 have the same configurations as those of each of the transistors of the circuit cell CELL14 in the first embodiment.

Through the above-mentioned connection, in the second embodiment, the driver transistors P53 and N53 are respectively arranged in the functional-element-free regions of the circuit cell CELL24 and the circuit cell CELL23, in place of the driver transistors P52 and N52 of the first embodiment.

In the N-well WN of the circuit cell CELL24, the driver transistor P53 is arranged, alongside of the functional transistor P24, in a region in which the functional transistor P24 is not arranged, specifically, a region adjacent to the Y-direction of the functional transistor P24 formed in the circuit cell CELL24. Similarly, in the P-well WP of the circuit cell CELL23, the driver transistor N53 is arranged, alongside of the functional transistor N23, in a region in which the functional transistor N23 is not arranged, specifically, a region adjacent to the Y-direction of the functional transistor N23 formed in the circuit cell CELL23.

In the second embodiment, the driver transistor can be arranged not only in the functional-element-free region adjacent to the X-direction of the functional transistor in the circuit cell, but also in the functional-element-free region adjacent to the Y-direction thereof.

According to this configuration, in the second embodiment, it is possible to more effectively use the functional-element-free region of the circuit cell than in the first embodiment. The semiconductor device includes the second power consumption circuit having a power shutdown configuration, which is capable of improving area use efficiency of the chip of the semiconductor device and reducing the sub-threshold leakage current to decrease power consumption at the time of the standby state. It is possible to suppress to a minimum an increase in the area of the semiconductor device by adding the driver circuit for controlling the second power supply potential.

Third Embodiment

Figure 11:
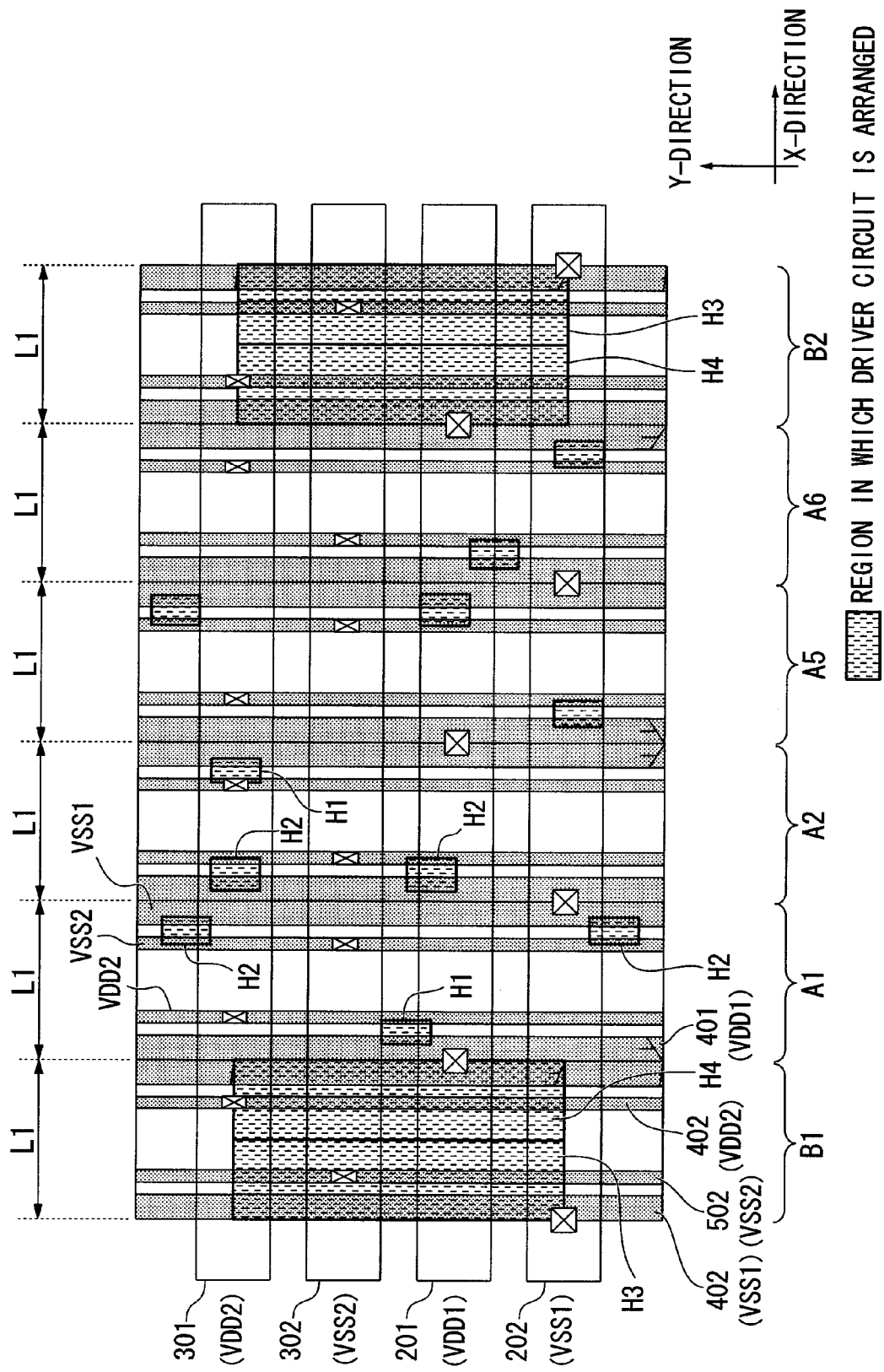
FIG. 11 is an enlarged view of a portion of a region A in the layout of the second power supply region shown in FIG. 2.

FIG. 11 is an enlarged view of the portion of a region A in the layout of the second power supply region 110 shown in FIG. 2, similarly to FIG. 3.

FIG. 11 is different from FIG. 3 in the positions at which the driver circuits H3 and H4 are arranged. FIG. 3 is an example in which the driver circuits H3 and H4 formed in the ends of the cell areas A1, A2, A5, and A6 in the Y-direction are concentrated on cell areas B1 and B2 different from the cell areas A1 to A6.

In this manner, in addition to dispersion and arrangement of the driver circuits H1 and H2 in each of the cell areas A1, A2, A5, and A6, the driver circuits H3 and H4 may be concentrated on other cell areas different from the cell areas A1 to A6.

Fourth Embodiment

FIGS. 12, 13, 14, and 15 are diagrams illustrating a configuration example according to a fourth embodiment of the driver transistor in the driver circuit formed in the functional-element-free region of the circuit cell. Meanwhile, in FIGS. 12 to 15, the interconnections that connect circuit cells CELL41a to CELL45a (FIGS. 12 and 13), CELL41b to CELL45b (FIG. 14), and CELL41c to CELL45c (FIG. 15) to each other are omitted.

Figure 12:
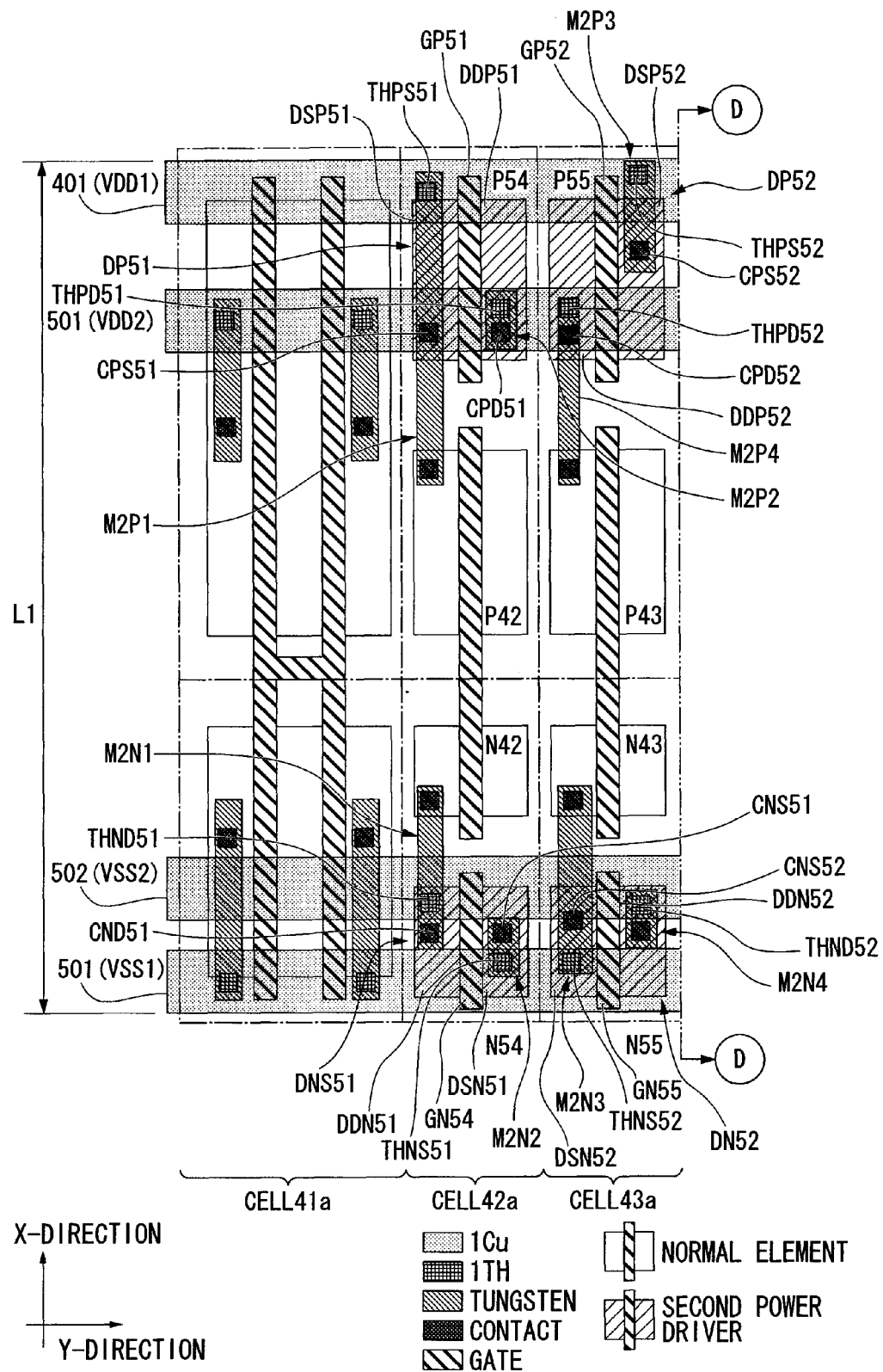
FIG. 12 is a diagram illustrating an example of the configuration of a driver transistor in a driver circuit in a functional-element-free region of the circuit cell according to an embodiment of the invention.
Figure 13:
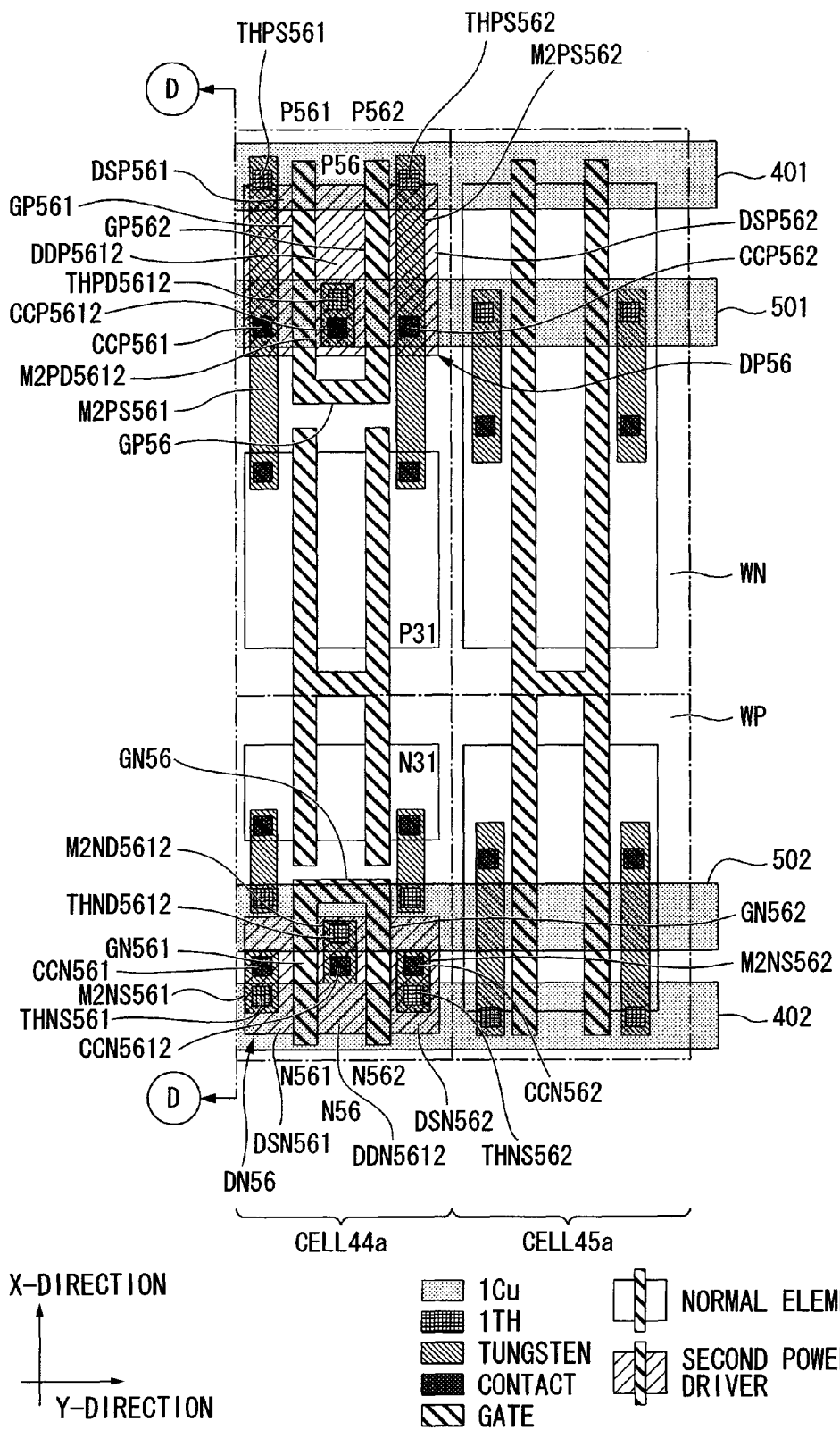
FIG. 13 is a diagram illustrating another example of the configuration of a driver transistor in a driver circuit in a functional-element-free region of the circuit cell according to an embodiment of the invention.

In FIGS. 12 and 13, the driver transistors that connect the main power supply local line 401 and the sub-power supply local line 501 or connect the main ground local line 402 and the sub-power supply local line 502, for a power shutdown configuration, are arranged in the circuit cells CELL42a, CELL43a and CELL44a adjacent to each other, in addition to the functional transistors. On the other hand, the circuit cells CELL41a and CELL45a which are not adjacent to each other are not provided with the driver transistors for a power shutdown configuration.

In FIGS. 12 and 13, a P-type transistor P54 and an N-type transistor N54 serving as the driver transistor are formed in the circuit cell CELL42a.

A P-type transistor P55 and an N-type transistor N55 serving as the driver transistor are formed on the circuit cell CELL43a.

A P-type transistor P56 serving as the driver transistor and an N-type transistor N56 serving as the driver transistor are formed in the circuit cell CELL44a.

As previously described, in the N-type transistor serving as the driver transistor, the sub-ground local line 502 is connected or disconnected to the main ground local line 402. In the P-type transistor serving as the driver transistor, the sub-power supply local line 501 is connected or disconnected to the main power supply local line 401.

Although not shown in the drawings, the control line of the control signal CTRP is connected to a gate electrode GP54 of the driver transistor P54, a gate electrode GP55 of the driver transistor P55, and a gate electrode GP56 of the driver transistor P56. Similarly, the control line of the control signal CTRN is connected to a gate electrode GN54 of the driver transistor N54, a gate electrode GN55 of the driver transistor N56, and a gate electrode GN57 of the driver transistor N56.

A method of controlling the control signals CTRP and CTRN in the standby state and the active state is the same as described in the above-mentioned first embodiment, and thus description thereof will be omitted herein.

In FIGS. 12 and 13, the configurations within the circuit cell of the circuit cells CELL41 and CELL45 are the same as that of the circuit cell CELL13 of the first embodiment. Similarly, the configurations of the circuit cells CELL42 and CELL43 are respectively the same as those of the circuit cells CELL11 and CELL12 of FIGS. 5 and 6.

The configurations of the P-type transistor P31 and the N-type transistor N31 arranged in the circuit cell CELL43 are the same as those of the P-type transistor P31 and the N-type transistor N31 serving as the functional transistor arranged in the circuit cell CELL13 of FIGS. 5 and 6, except for the size of the transistor.

In FIGS. 12 and 13, the driver transistor P56 arranged in the circuit CELL44a is constituted by two P-type transistors P561 and P562 having a one-sided diffusion layer DDP5612 in common. Similarly, the driver transistor N56 is constituted by two N-type transistors N561 and N562 having a one-sided diffusion layer DDN5612 in common.

In the driver transistor P56, a gate electrode GP561 of the P-type transistor P561 and a gate electrode GP562 of the P-type transistor P562 are connected to each other through a gate interconnection GP56, and thus form a common gate electrode.

In the driver transistor P56, an interconnection M2PS561 is connected to a diffusion layer (source) DSP561 of the P-type transistor P561 through a contact CCP561. An interconnection M2PD5612 is connected to the diffusion layer (drain) DDP5612 which the P-type transistors P561 and P562 share through a contact CCP5612. An interconnection M2PS562 is connected to a diffusion layer (source) DSP562 of the P-type transistor P562 through a contact CCP562. The interconnection M2PS561 is connected to the main power supply local line 401 through a through-hole THPS561, and the interconnection M2PS562 is connected to the main power supply local line 401 through a through-hole THPS562. The interconnection M2PD5612 is connected to the sub-power supply local line 501 through a through-hole THPD5612.

In the driver transistor N56, an interconnection M2NS561 is connected to a diffusion layer (source) DSN561 of the N-type transistor N561 through a contact CCN561, an interconnection M2ND5612 is connected to the diffusion layer (drain) DDN5612 which the N-type transistors N561 and N562 share through a contact CCN5612. An interconnection M2NS562 is connected to a diffusion layer (source) DSN562 of the N-type transistor N562 through a contact CCN562. The interconnection M2NS561 is connected to the main ground local line 402 through a through-hole THNS561. The interconnection M2NS562 is connected to the main ground local line 402 through a through-hole THNS562. The interconnection M2ND5612 is connected to the sub-ground local line 502 through a through-hole THND5612.

In this manner, it is possible to easily increase the channel width of the driver transistor twice by using two transistors sharing the one-sided diffusion layer as the driver transistor. When the circuit cell has a plurality of each of the channel type transistors such as the NOR circuit or the NAND circuit, the dimensions in the Y-direction mentioned above are larger than those of other circuit cells, and thus the configuration in which the drain is easily shared can be taken. As a result, the channel width of the driver transistor in the circuit cell is made large, whereby it is possible to increase current capacity from the main power supply local line 401 to the sub-power supply local line 501, or current capacity from the sub-ground local line 402 to the main ground local line 502.

Figure 14:
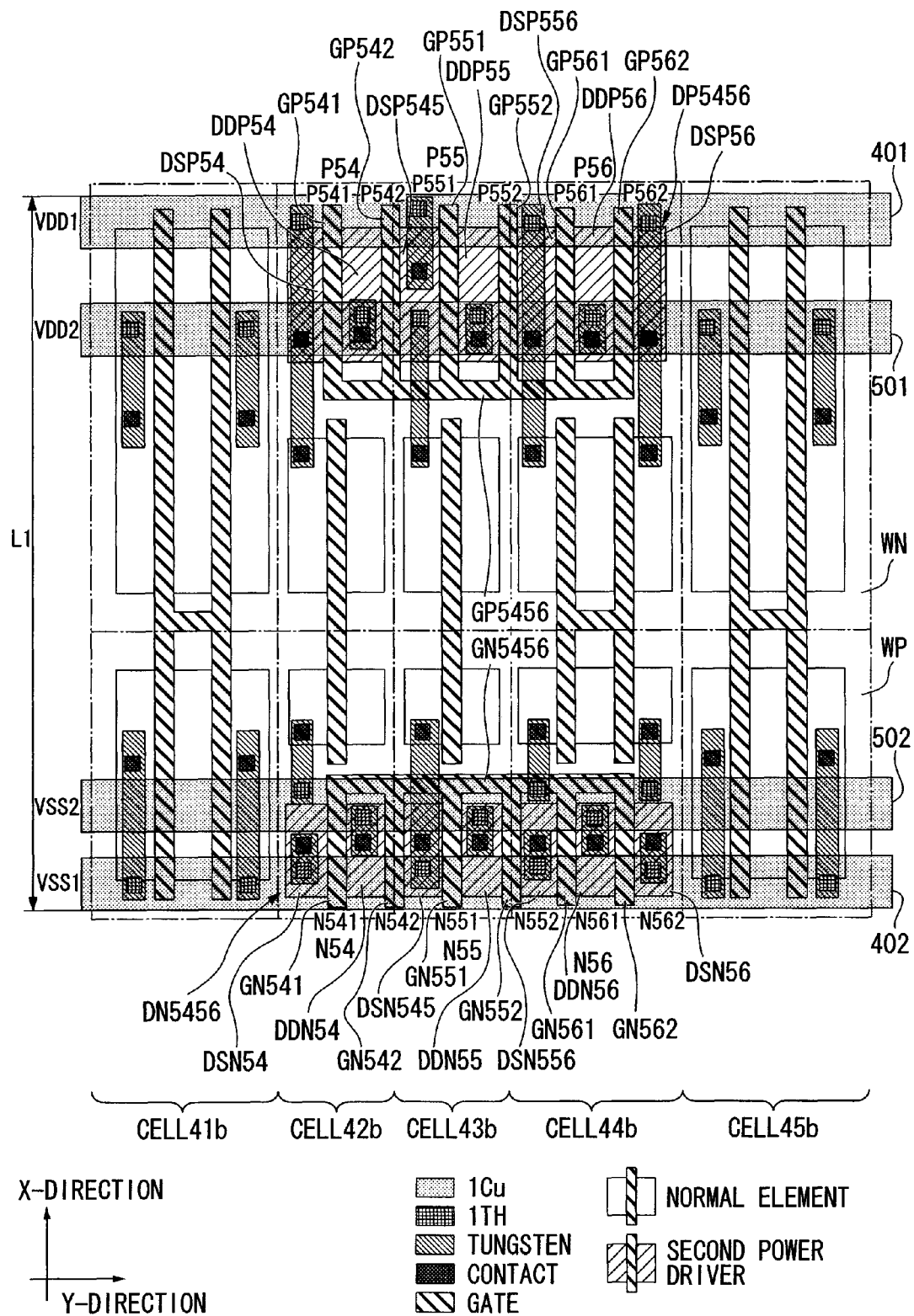
FIG. 14 is a diagram illustrating still another example of the configuration of a driver transistor in a driver circuit in a functional-element-free region of the circuit cell according to an embodiment of the invention.

FIG. 14 is a diagram illustrating a first modified example of the driver transistor formed in the functional-element-free region of the circuit cell shown in FIGS. 12 and 13 mentioned above.

The circuit cells CELL42b, CELL43b, and CELL44b of FIG. 14 are different from the circuit cells CELL42a, CELL43a, and CELL44a of FIGS. 12 and 13 in that the driver transistors P54, P55, and P56 which are respectively arranged therein share an active region DP5456, and similarly the driver transistors N54, N55, and N56 share an active region DN5456.

In this manner, when the driver transistors are arranged in the adjacent regions of the adjacent circuit cells, the active regions thereof can be set to one common active region. That is, when a plurality of driver transistors is formed in the adjacent regions of the adjacent circuit cells, the active regions of the plurality of driver transistors may be shared.

In FIG. 14, the driver transistor P54 includes P-type transistors P541 and P542, the driver transistor P55 includes P-type transistors P551 and P552, and the driver transistor P56 includes P-type transistors P561 and P562. Here, gate electrodes GP541 and GP542 of the driver transistor P54, gate electrodes GP551 and GP552 of the driver transistor P55, and gate electrodes GP561 and GP562 of the driver transistor P56 are commonly connected to a gate interconnection GP5456.

A diffusion layer (drain) DDP54 is shared by the P-type transistors P541 and P542. A diffusion layer (source) DSP545 is shared by the P-type transistors P542 and P551. A diffusion layer (drain) DDP55 is shared by the P-type transistors P551 and P552. A diffusion layer (source) DSP556 is shared by the P-type transistors P552 and P561. A diffusion layer (drain) DDP56 is shared by the P-type transistors P561 and P562. In this manner, the driver transistors P54, P55 and P56 are formed as a structure of one driver transistor through the active region DP5456 formed in continuation with a plurality of cells CELL42a, CELL43a and CELL44b which are adjacent to each other.

The driver transistor N54 includes N-type transistors N541 and N542, the driver transistor N55 includes N-type transistors N551 and N552, and the driver transistor N56 includes N-type transistors N561 and N562. Here, gate electrodes GN541 and GN542 of the driver transistor N54, gate electrodes GN551 and GN552 of the driver transistor N55, and gate electrodes GN561 and GN562 of the driver transistor N56 are commonly connected to a gate interconnection GN5456.

A diffusion layer (drain) DDN54 is shared by the N-type transistors N541 and N542. A diffusion layer (source) DSN545 is shared by the N-type transistors N542 and N551. A diffusion layer (drain) DDN55 is shared by the N-type transistors N551 and N552. A diffusion layer (source) DSN556 is shared by the N-type transistors N552 and N561. A diffusion layer (drain) DDN56 is shared by the N-type transistors N561 and N562. In this manner, the driver transistors N54, N55 and N56 are formed as a structure of one driver transistor through the active region DN5456 formed in continuation with a plurality of cells CELL42a, 43a and CELL44b which are adjacent to each other.

Similarly to the first and second embodiments, the diffusion layers of each source of the driver transistors P54, P55 and P56 are connected to the interconnections of the sources through the contacts. These interconnections are connected to the main power supply local line 401 through the through-holes. The diffusion layers of each drain of the driver transistors P54, P55 and P56 are connected to the interconnections of the drains through the contacts, and these interconnections are connected to the sub-power supply local line 501 through the through-holes.

Similarly to the first and second embodiments, the diffusion layers of each source of the driver transistors N54, N55 and N56 are connected to the interconnections of the sources through the contacts. These interconnections are connected to the main ground local line 402 through the through-holes. The diffusion layers of each drain of the driver transistors N54, N55 and N56 are connected to the interconnections of the drains through the contacts, and these interconnections are connected to the sub-ground local line 502 through the through-holes.

From the above-mentioned configuration, in the first modified example, it is possible to secure the region included in the driver circuit with a larger area than that of the fourth embodiment, to form the active region, in which the driver transistor is formed, as a long active region extending in the Y-direction which is an arrangement direction of the circuit cell, to share not only the drains of the driver transistors adjacent to each other but also the sources, and to more effectively use the functional-element-free region.

Figure 15:
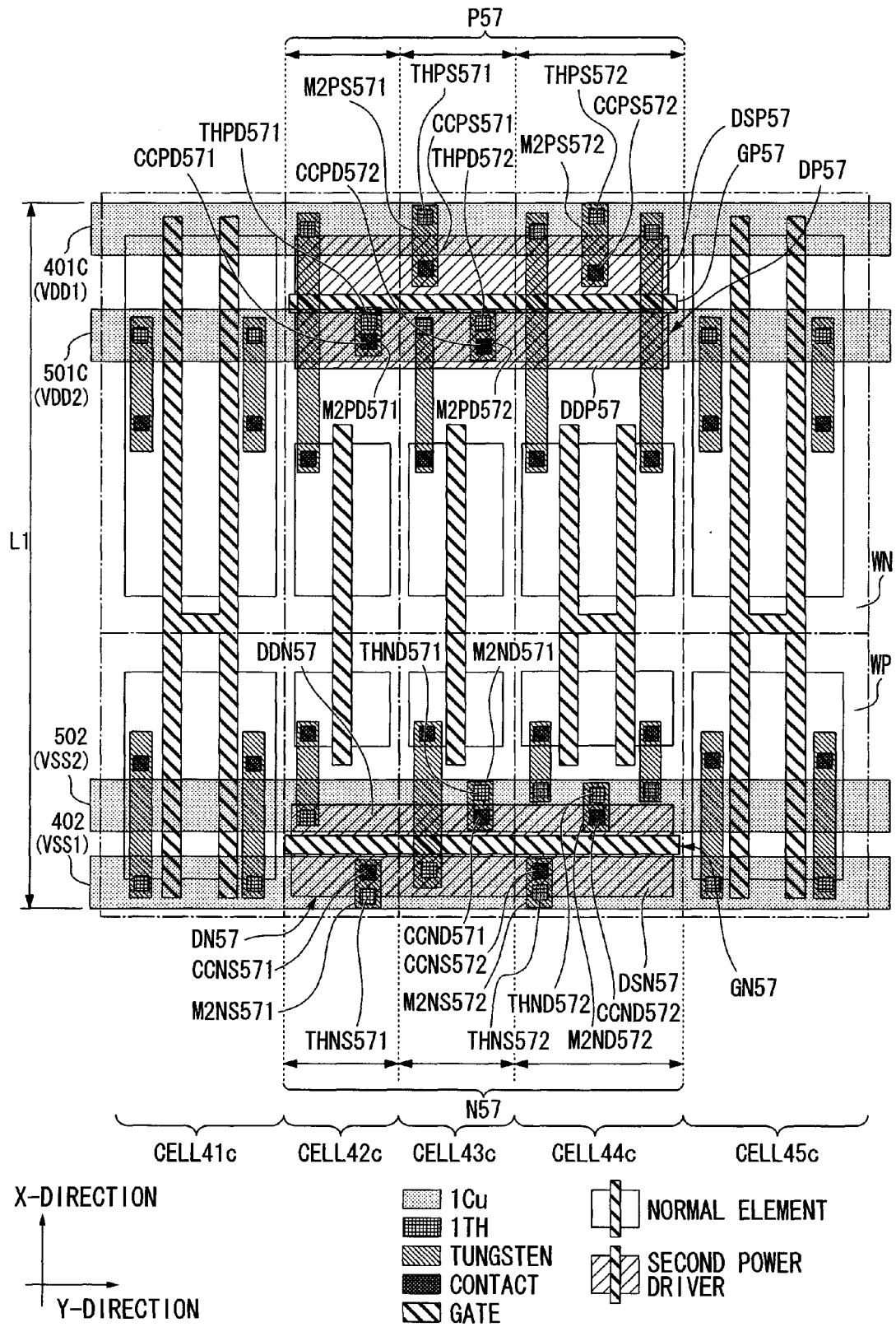
FIG. 15 is a diagram illustrating yet another example of the configuration of a driver transistor in a driver circuit in a functional-element-free region of the circuit cell according to an embodiment of the invention.

FIG. 15 is a diagram illustrating a second modified example of the driver transistor formed in the functional-element-free region of the circuit cell mentioned above.

The circuit cells CELL42c, CELL43c, and CELL44c of FIG. 15 are different from the circuit cells CELL42a, CELL43a, and CELL44a of FIGS. 12 and 13 in the following points of view. The active regions in which the driver transistors P54, P55, and P56 which are respectively arranged therein are formed the active regions in which the driver transistors N54, N55, and N56 are formed are respectively shared. The gate electrodes and the source/drain diffusion layers extending in the Y-direction are further formed in these shared active regions.

A driver transistor P57 is formed on the upper portion of a common active region DP57 formed on the N-well region of the circuit cells CELL42c, CELL43c, and CELL44c with an insulating film interposed between the common active region DP57 and the N-well region. The driver transistor P57 includes a gate electrode GP57 extending in the Y-direction on side of the N-well region of the circuit cells CELL42c, CELL43c, and CELL44c. This gate electrode GP57 is supplied with a control signal CNTP which is not shown in the drawings.

A diffusion layer DSP57 as a diffusion layer (for example, source) of one side of the driver transistor P57 and a diffusion layer DDP57 as a diffusion layer (for example, drain) of the other side thereof are formed in the common active region DP57 in which the driver transistor P57 is formed, a region in the semiconductor substrate interposed between the diffusion layer DSP57 and the diffusion layer DDP57 forms a channel region (not shown), and the gate electrode GP57 is formed on this channel region.

Similarly, a driver transistor N57 is formed on the upper portion of a common active region DN57 formed on side of the P-well region of the circuit cells CELL42c, CELL43c, and CELL44c. The driver transistor N57 includes the gate electrode GN57 extending in the Y-direction on side of the P-well region of the circuit cells CELL42c, CELL43c, and CELL44c. The driver transistor N57 includes an insulating film interposed between the common active region DN57 and the gate electrode GN57. This gate electrode GN57 is supplied with a control signal CNTN which is not shown in the drawings.

A diffusion layer DSN57 as a diffusion layer (for example, source) of one side of the driver transistor N57 and a diffusion layer DDN57 as a diffusion layer (for example, drain) of the other side thereof are formed in the common active region DN57 in which the driver transistor N57 is formed. A region in the semiconductor substrate interposed between a diffusion layer DDS57 and the diffusion layer DDN57 forms a channel region (not shown). The gate electrode GN57 is formed on this channel region.

In the driver transistor P57, the diffusion layer (source) DSP57 is connected to the main power supply local line 401 through a contact CCPS571, an interconnection M2PS571 and a through-hole THPS571, or through a contact CCPS572, an interconnection M2PS572 and a through-hole THPS572.

The diffusion layer (drain) DDP57 is connected to the sub-power supply local line 501 through a contact CCPD571, an interconnection M2PD571 and a through-hole THPD571, or through a contact CCPD572, an interconnection M2PD572 and a through-hole THPD572.

In the driver transistor N57, the diffusion layer (source) DSN57 is connected to the main ground local line 402 through a contact CCNS571, an interconnection M2NS571 and a through-hole THNS571, or through a contact CCNS572, an interconnection M2NS572 and a through-hole THNS572.

The diffusion layer (drain) DDN57 is connected to the sub-ground local line 502 through a contact CCND571, an interconnection M2ND571 and a through-hole THND571, or through a contact CCND572, an interconnection M2ND572 and a through-hole THND572.

From the above-mentioned configuration, the driver transistor P57 is formed as a driver circuit that connects the main power supply local line 401 and the sub-power supply local line 501, or is formed as a driver circuit that connects a driver transistor N57, the main ground local line 402 and the sub-ground local line 502, and thus each of them functions.

As mentioned above, in the second modified example, when there is an functional-element-free region having a width in the X-direction in which the long direction of the gate interconnections (GP57 and GN57) is arranged in the Y-direction and the contact is formed in the diffusion layer on both sides of the gate interconnection, even in the case where the width in X-direction capable of arranging the transistors is small, it is possible to form the functional-element-free region as the arrangement rotated 90 degrees with respect to the layout of the transistors included in the normal circuit, and to form the channel width to the length corresponding to the width in the Y-direction of the circuit cell having an adjacent functional-element-free region.

The normal transistor (normal element) is configured as follows. The source section, the gate interconnection, and the drain section are series-arranged in the Y-direction. However, the normal transistor is configured so that the source section, the gate interconnection, and the drain section are series-arranged in the X-direction, whereby it is possible to effectively use the width in the Y-direction of the functional-element-free region of the adjacent circuit cell, to increase the channel width of the transistor, and to reduce on-resistance at the time of turn-on.

As described above, although the embodiments of the invention have been described in detail with reference to the drawings, specific configurations are not limited to these embodiments, but may include other designs and the like without departing from the scope of the invention.

As an example, for example, in the above-mentioned embodiments 1 to 4, the second power consumption circuit that uses two power supply potentials of a main power supply and a sub-power supply and two ground potentials of a main ground and a sub-ground are shown as an example of a circuit that uses a power shutdown configuration.

A circuit that uses three power supply potentials of a main power supply VDD1, a first sub-power supply VDD2, and a second sub-power supply VDD3 and three ground potentials of a main ground VSS1, a first sub-ground potential VSS2, and a second sub-ground potential VSS3 may be used as a circuit that uses a power shutdown configuration, in place of the configuration of the two power supplies.

Figure 16:
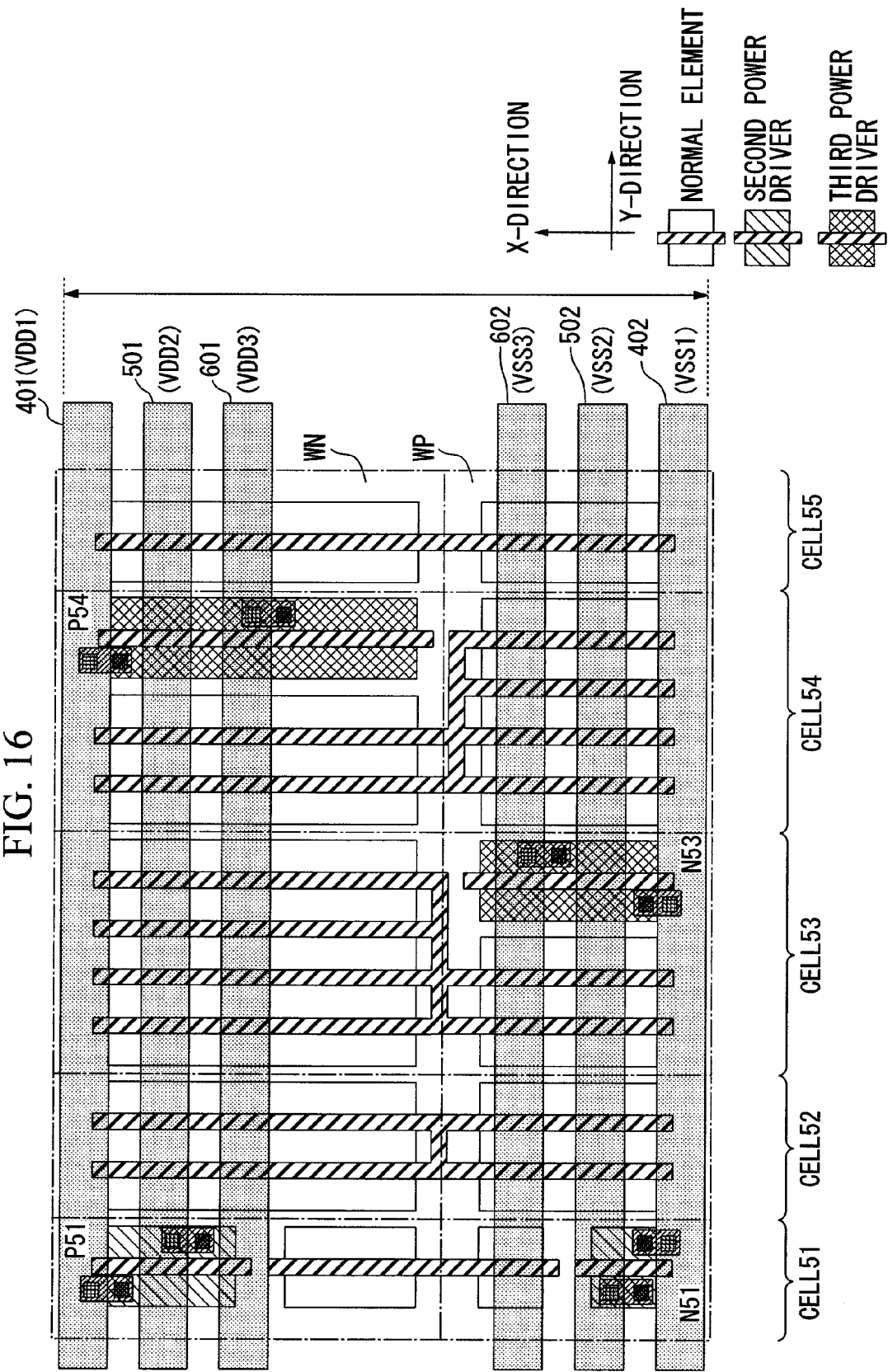
FIG. 16 is a diagram illustrating an example of the configuration of transistors in a buffer circuit in the functional-element-free region of the circuit cell according to an embodiment of the invention.

FIG. 16 is a diagram illustrating a configuration example of transistors in a buffer circuit formed in the functional-element-free region of the circuit cell in three power supply potentials of the main power supply VDD1, the first sub-power supply VDD2, and the second sub-power supply VDD3 and three ground potentials of the main ground VSS1, the first sub-ground potential VSS2, and the second sub-ground potential VSS3.

Even in the case of the circuit that uses these three power supply potentials and three ground potentials, the driver circuit (P-type transistor P51) that connects the main power supply local line 401 and the sub-power supply local line 501 of the first sub-power supply potential VDD2, the driver circuit (P-type transistor P54) that connects the main power supply local line 401 and the sub-power supply local line 601 of the second sub-power supply potential VDD3, the driver circuit (N-type transistor N51) that connects the main ground local line 402 and the first sub-ground local line 502 of the first sub-ground potential VSS2, and the driver circuit (N-type transistor N53) that connects the main ground local line 402 and the second sub-local line 602 of the second sub-ground potential VSS3 are arranged within the same circuit cell as that of the circuit elements included in the circuit that uses a power shutdown configuration, whereby it is possible to obtain the same effect as that of the invention described in the above-mentioned first to fourth embodiments.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:
1. A semiconductor device comprising:
a circuit comprising:
first and second power lines extending in a first direction;
a plurality of circuit cells aligned in the first direction, each of the plurality of circuit cells comprising a first region of a first conductivity type;
a plurality of first transistors disposed in the first regions of parts of the plurality of circuit cells, each of the plurality of first transistors comprising first and second diffusion layers and a first gate electrode;
a plurality of second transistors disposed in the first regions of the remaining parts of the plurality of circuit cells, each of the plurality of second transistors comprising third and fourth diffusion layers and a second gate electrode;

a third transistor disposed in the first region of one of the plurality of circuit cells, the third transistor comprising fifth and sixth diffusion layers and a third gate electrode;

a plurality of first interconnections connecting the first power line to the first diffusion layers of the plurality of first transistors;

a plurality of second interconnections connecting the second power line to the third diffusion layers of the plurality of second transistors;

a third interconnection connecting the first power line to the fifth diffusion layer of the third transistor; and a fourth interconnection connecting the second power line to the sixth diffusion layers of the third transistor, and wherein the circuit is configured to reduce a sub-threshold leakage current of the plurality of first transistors and the plurality of second transistors.

2. The semiconductor device according to claim 1, wherein each of the plurality of circuit cells comprises a second region of a second conductivity type different from the first conductivity type, and first and second regions of each of the plurality of circuit cells being aligned in line in the second direction substantially parallel to the first direction, and wherein the circuit further comprises:

third and fourth power lines extending in the first direction;

a plurality of fourth transistors disposed in the second regions of parts of the plurality of circuit cells, each of the plurality of fourth transistors comprising seventh and eighth diffusion layers and a fourth gate electrode;

a plurality of fifth transistors disposed in the second regions of the remaining parts of the plurality of circuit cells, each of the plurality of fifth transistors comprising ninth and tenth diffusion layers and a fifth gate electrode;

a sixth transistor disposed in the second region of one of the plurality of circuit cells, the sixth transistor comprising eleventh and twelfth diffusion layers and a sixth gate electrode;

a plurality of fifth interconnections that connects the third power line to the seventh diffusion layers of the plurality of fourth transistors;

a plurality of sixth interconnections that connects the fourth power line to the ninth diffusion layers of the plurality of fifth transistors;

a seventh interconnection that connects the third power line to the eleventh diffusion layer of the sixth transistor; and an eighth interconnection that connects the fourth power line to the twelfth diffusion layer of the sixth transistor, and wherein the circuit is further configured to reduce a sub-threshold leakage current of the plurality of fourth transistors and the plurality of fifth transistors.

3. The semiconductor device according to claim 2, wherein the plurality of circuit cells comprises:

a plurality of first circuit cells, each of the plurality of first circuit cells comprising a corresponding one of the plurality of first transistors and a corresponding one of the plurality of fourth transistors; and a plurality of second circuit cells, each of the plurality of second circuit cells comprising a corresponding one of the plurality of second transistors and a corresponding one of the plurality of fifth transistors, wherein the plurality of first circuit cells and the plurality of second circuit cells are alternately arranged.

4. The semiconductor device according to claim 2, wherein the first power line has a first power potential, when the circuit is in a stand-by state, the third power line has a second power potential lower than the first power potential and the third transistor disconnects the first power line from the second power line.

5. The semiconductor device according to claim 1, wherein the third gate electrode of the third transistor is configured to receive a first control signal, the first control signal takes a first logic level such that the third transistor is placed in a conductive state when the circuit is in an active state, the first control signal takes a second logic level and the third transistor is placed in a non-conductive state when the circuit is in a stand-by state.

6. The semiconductor device according to claim 1, wherein the third transistor is placed to extend over two adjacent circuit cells of the plurality of circuit cells.

7. The semiconductor device according to claim 6, wherein the third gate electrode and the fifth and sixth diffusion layers of the third transistor placed over the two adjacent circuit cells extend in the first direction.

8. A device comprising:

a circuit comprising:

first and second power lines each extending in a first direction, a plurality of circuit cells arranged in line in the first direction, each of the circuit cells including a logic circuit, one of the plurality of circuit cells further including a first drive transistor that comprises first and second diffusion layers and a first channel region between the first and second diffusion layers, the logic circuit included in the one of the circuit cells including a first functional transistor that has third and fourth diffusion layers and a second channel region between the third and fourth diffusion layers, and each of the third and fourth diffusion layers being formed separately from the first and second diffusion layers;

a first interconnection connecting the first power line with the first diffusion layer of the first driver transistor;

a second interconnection connecting the second power line with the second diffusion layer of the first driver transistor; and a third interconnection connecting the second power line with the third diffusion layer of the first functional transistor, wherein the circuit is configured to reduce a sub-threshold leakage current of the first functional transistor.

9. The device as claimed in claim 8, wherein each of the circuit cells includes a first region of a first conductivity type and a second region of a second conductivity type different from the first conductivity type, the first and second regions are arranged, in each of the circuit cells, in line in a second direction that crosses the first direction, and both of the first driver transistor and the first function transistor are disposed in the first region of the one of the circuit cells.

10. The device as claimed in claim 9, wherein the first driver transistor and the first functional transistor are arranged, in the first region of the one of the circuit cells, in line in the second direction.

11. The device as claimed in claim 9, wherein the first driver transistor and the first functional transistor are arranged, in the first region of the one of the circuit cells, in line in the first direction.

12. The device as claimed in claim 9, wherein the logic circuit included in another one of the circuit cells includes a second functional transistor disposed in the first region of the another one of the circuit cells, the second functional transistor has fifth and sixth diffusion layers and a third channel region between the fifth and sixth diffusion layers, the circuit further comprises a fourth interconnection connecting the second power line to the fifth diffusion layer of the second functional transistor.

13. The device as claimed in claim 12, wherein each of the fifth and sixth diffusion layers is greater in length in the second direction than each of the third and fourth diffusion layers of the first functional transistor.

14. The device as claimed in claim 12, wherein the first power line is a main power supply local line and the second power line is a sub-power supply local line.

15. The device as claimed in claim 8, wherein the circuit cells are substantially equal in length in a second direction crossing the first direction to each other.

16. The device as claimed in claim 9, wherein the logic circuit included in the one of the circuit cells further includes a second functional transistor disposed in the second region of the one of the circuit cells, and the first driver transistor, the first functional transistor and the second functional transistor are arranged, in the one of the circuit cells, in line in the second direction.

17. The device as claimed in claim 9, wherein the one of the circuit cells further includes a second driver transistor having fifth and sixth diffusion layers and a third channel region between the fifth and sixth diffusion layers and a second functional transistor having seventh and eighth diffusion layers and a fourth channel region between the seventh and eighth diffusion layers, each of the seventh and eighth diffusion layers being formed separately from the fifth and sixth diffusion layers, both of the second driver transistor and the second functional transistor are disposed in the second region of the one of the circuit cells, the circuit further comprises, third and fourth power lines each extending in the first direction, a fourth interconnection connecting the third power line with the fifth diffusion layer of the second driver transistor, a fifth interconnection connecting the fourth power line with the sixth diffusion layer of the second driver transistor, and a sixth interconnection connecting the third power line with the seventh diffusion layer of the second functional transistor, and wherein the circuit is further configured to reduce a sub-threshold leakage current of the second functional transistor.

18. The device as claimed in claim 17, wherein the first and second driver transistors and the first and second functional transistors are arranged, in the one of the circuit cells, in line in the second direction.

19. The device as claimed in claim 18, wherein the first and second functional transistors are between the first driver transistor and the second driver transistor.

20. The device as claimed in claim 9, wherein the logic circuit included in another one of the circuit cells includes a second driver transistor having fifth and sixth diffusion layers and a third channel region between the fifth and sixth diffusion layers and a second functional transistor having seventh and eighth diffusion layers and a fourth channel region between the seventh and eighth diffusion layers, both of the second driver transistor and the second functional transistor are disposed in the second region of the another one of the circuit cells, the circuit further comprises, third and fourth power lines each extending in the first direction, a fourth interconnection connecting the third power line with the fifth diffusion layer of the second driver transistor, a fifth interconnection connecting the fourth power line with the sixth diffusion layer of the second driver transistor, and a sixth interconnection connecting the third power line with the seventh diffusion layer of the second functional transistor, and wherein the circuit is further configured to reduce a sub-threshold leakage current of the second functional transistor.

* * * * *